(12) United States Patent
Oyu

(10) Patent No.: US 8,778,770 B2
(45) Date of Patent: Jul. 15, 2014

(54) SEMICONDUCTOR DEVICE AND METHOD FOR MANUFACTURING THE SAME

(75) Inventor: Kiyonori Oyu, Tokyo (JP)

(73) Assignee: PS4 Luxco S.A.R.L., Luxembourg (LU)

( * ) Notice: Subject to any disclaimer, the term of this patent is extended or adjusted under 35 U.S.C. 154(b) by 67 days.

(21) Appl. No.: 13/417,806

(22) Filed: Mar. 12, 2012

(65) Prior Publication Data

US 2012/0261733 A1 Oct. 18, 2012

(30) Foreign Application Priority Data

Apr. 13, 2011 (JP) ................... 2011-089194

(51) Int. Cl.
*H01L 21/20* (2006.01)
*H01L 27/108* (2006.01)

(52) U.S. Cl.
USPC .......................................... 438/391; 257/301

(58) Field of Classification Search
USPC .......... 438/244, 248, 386, 391; 257/296, 301, 257/E27.017–E27.025
See application file for complete search history.

(56) References Cited

U.S. PATENT DOCUMENTS

| 7,319,603 | B2 * | 1/2008 | Osada et al. ..................... 365/51 |
| 7,687,351 | B2 * | 3/2010 | Oyu .............................. 438/268 |
| 7,939,876 | B2 * | 5/2011 | Cheng et al. .................. 257/301 |
| 2004/0125676 | A1 | 7/2004 | Osada et al. |
| 2006/0028853 | A1 | 2/2006 | Osada et al. |
| 2007/0241373 | A1 | 10/2007 | Kuroi et al. |
| 2010/0285651 | A1 | 11/2010 | Kuroi et al. |

FOREIGN PATENT DOCUMENTS

| JP | 2001-044441 | 2/2001 |
| JP | 2001-168338 | 6/2001 |
| JP | 2001-237328 | 8/2001 |
| JP | 2004-213719 | 7/2004 |

* cited by examiner

*Primary Examiner* — Calvin Lee
(74) *Attorney, Agent, or Firm* — Young & Thompson

(57) ABSTRACT

A semiconductor device comprises a trench isolation. The trench isolation is formed in a surface of a semiconductor substrate to define an active region a well region, and a bottom of the trench isolation is positioned within the well region. The trench isolation includes a conductive wiring electrically connected to the well region and an insulating film which buries the conductive wiring in the bottom of the trench isolation. Semiconductor elements are disposed in the active region.

20 Claims, 45 Drawing Sheets

FIG.4
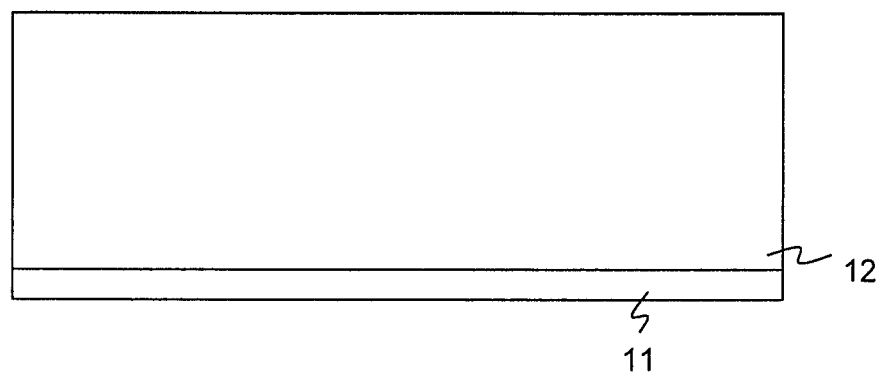
A
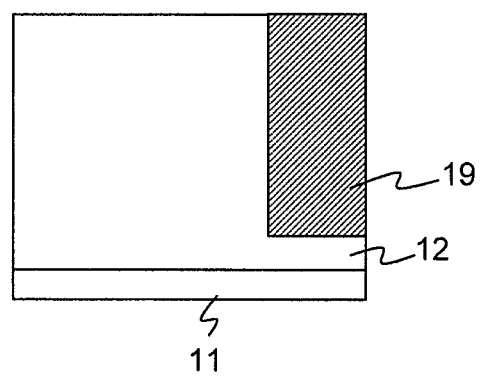
B

FIG.5
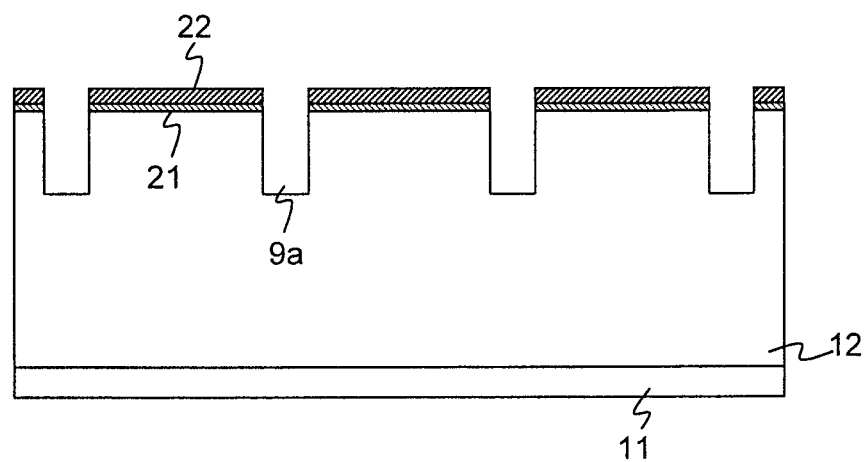
A
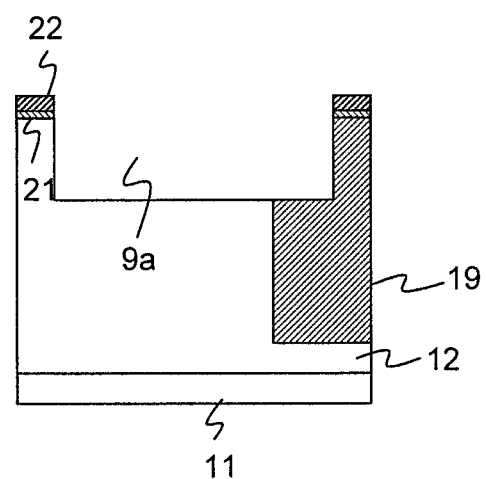
B

FIG.6
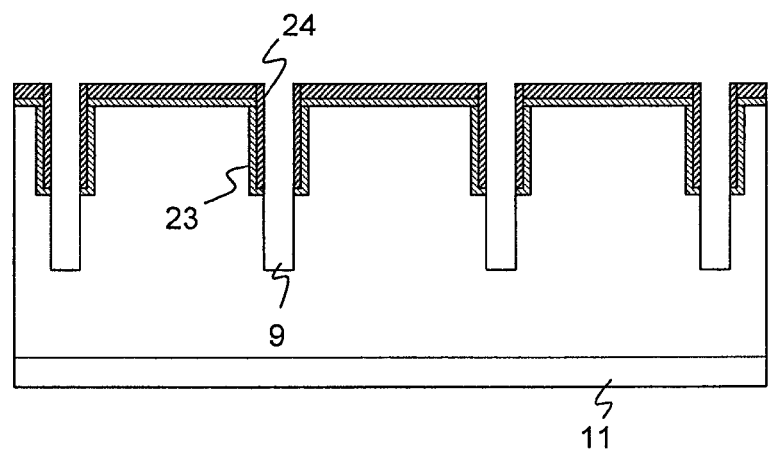
A
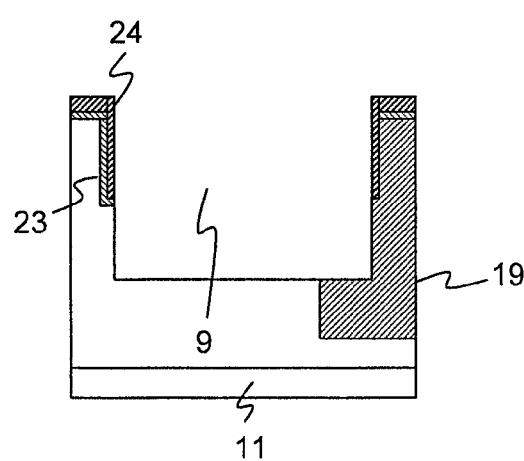
B

FIG.7
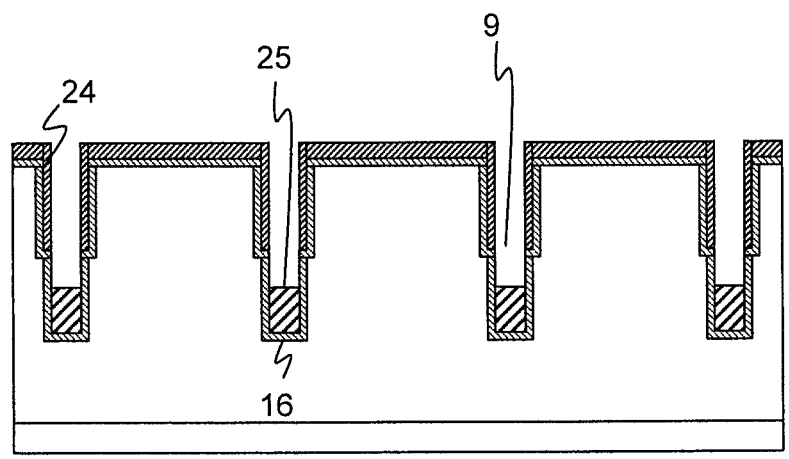
A
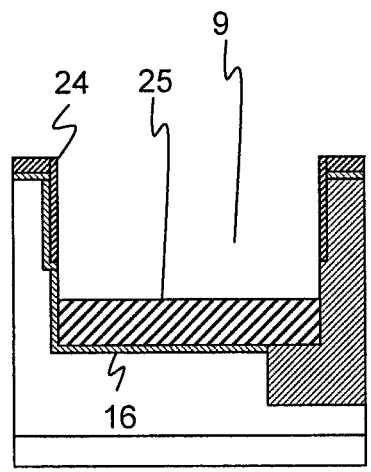
B

FIG.8
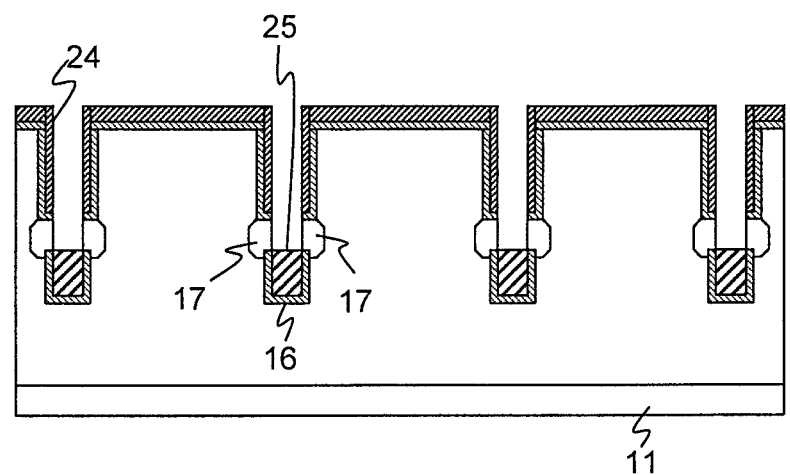
A
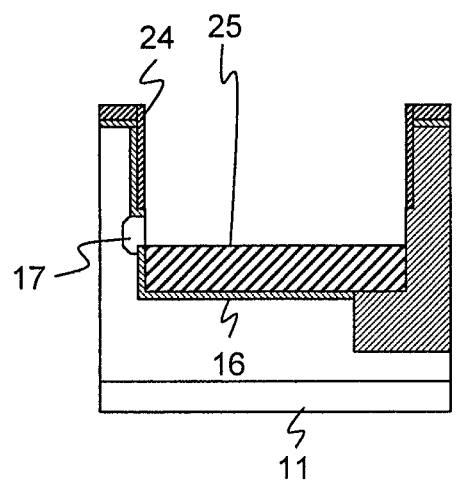
B

FIG.9
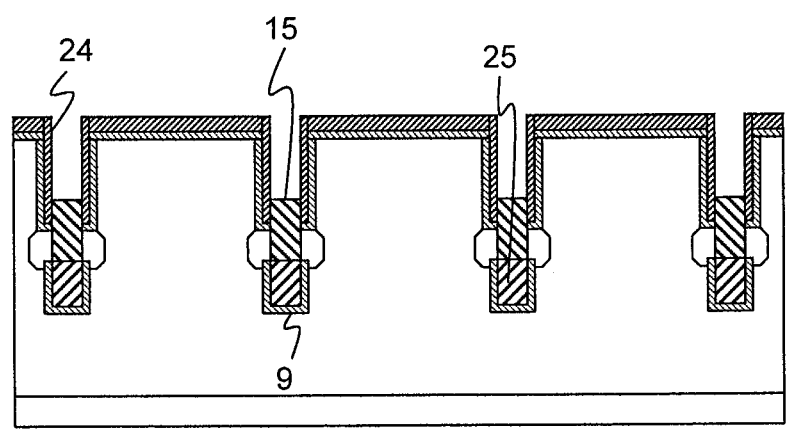
A
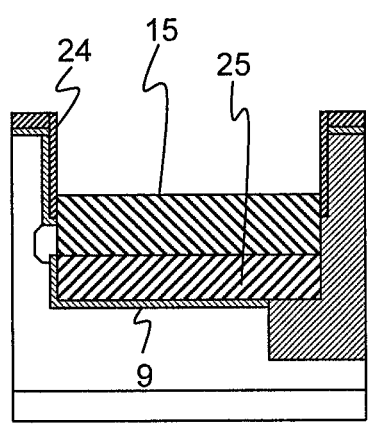
B

FIG.10
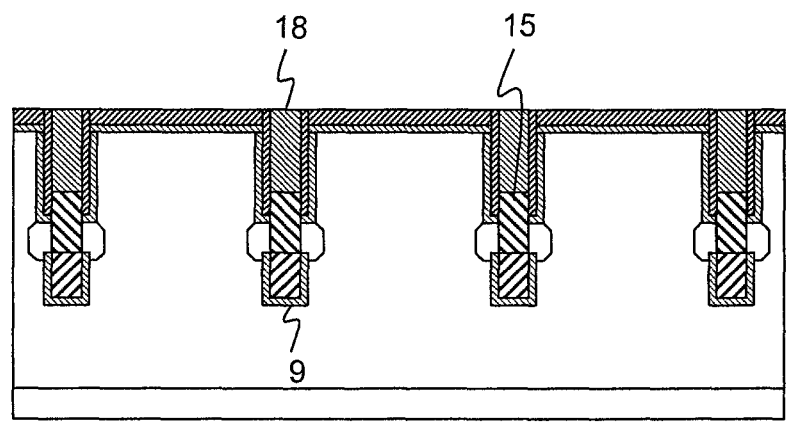
A
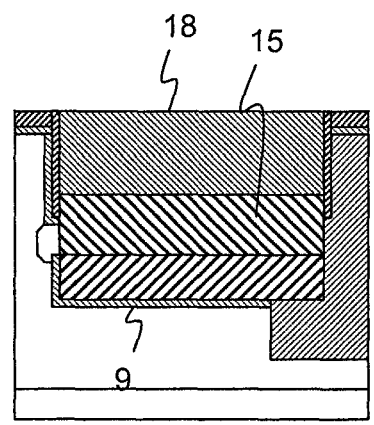
B

FIG.11
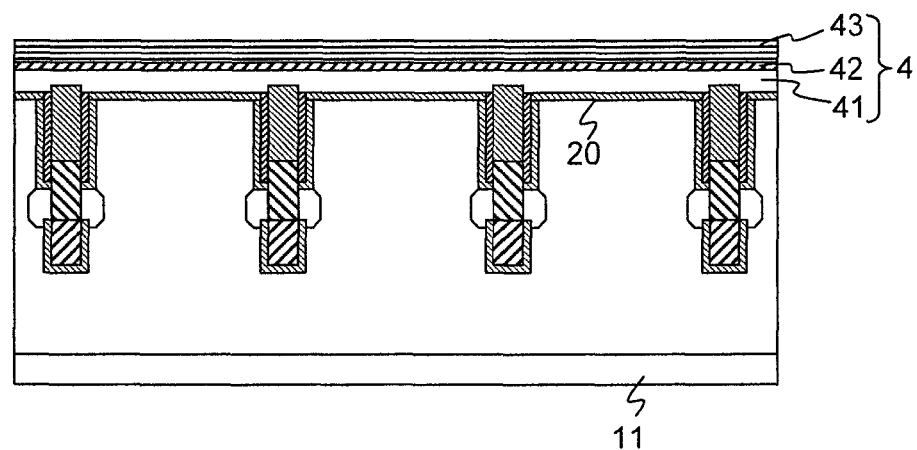
A
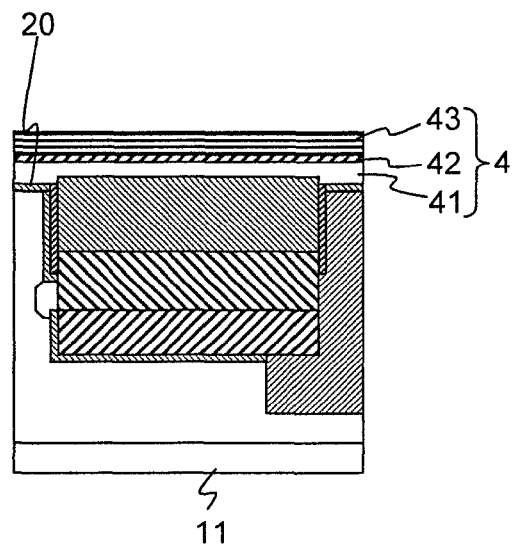
B

FIG.12
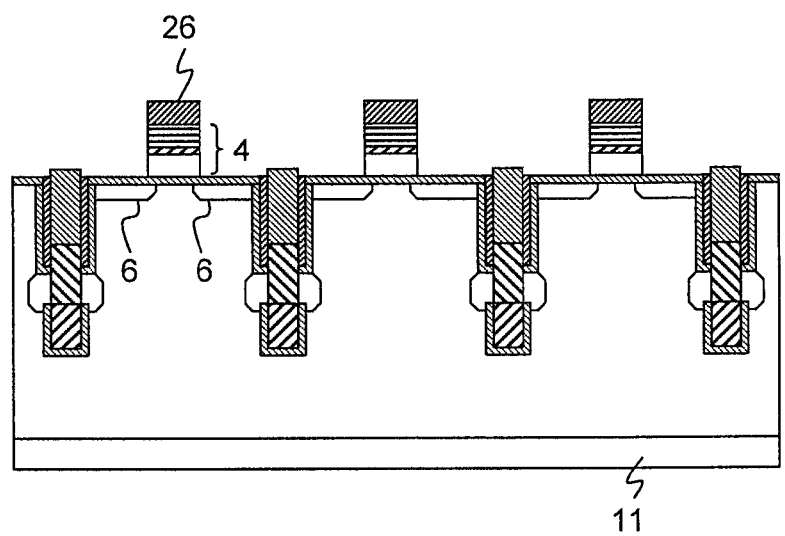
A
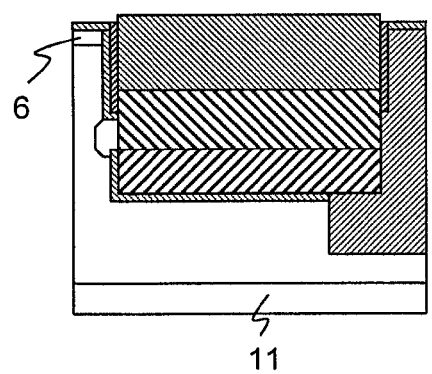
B

FIG.13
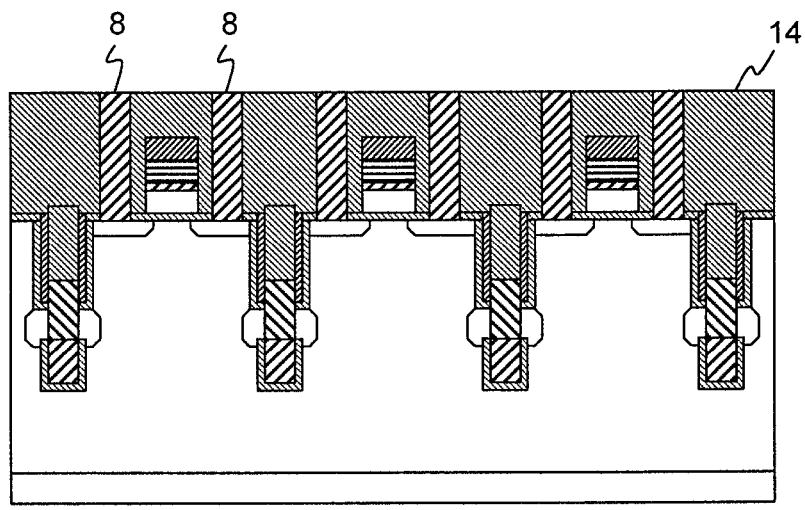
A
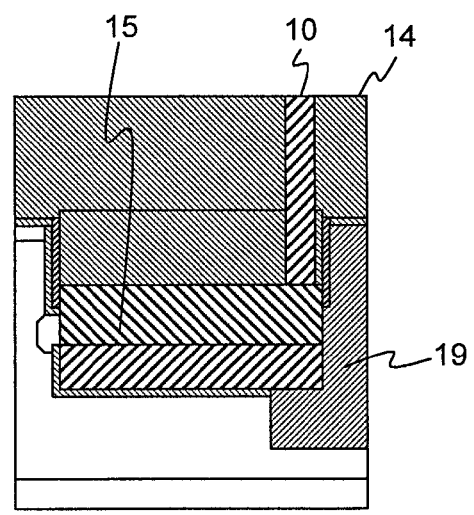
B

FIG.14
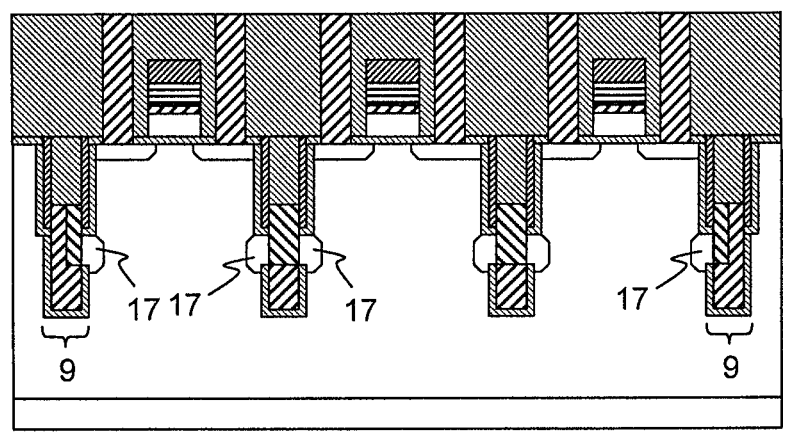
A
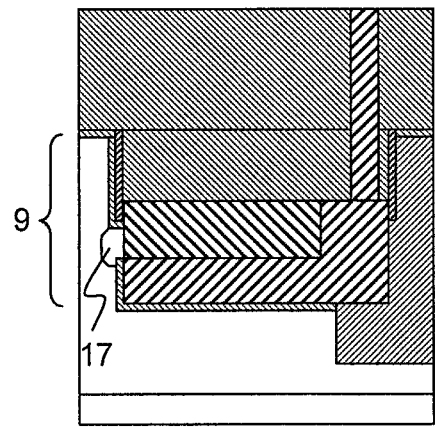
B

FIG.15
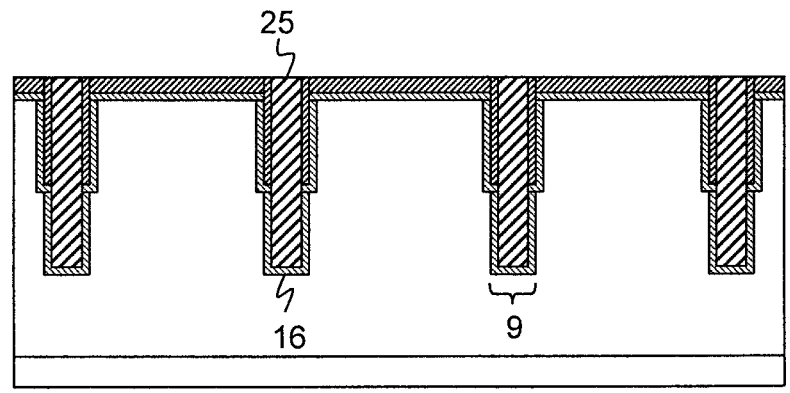
A
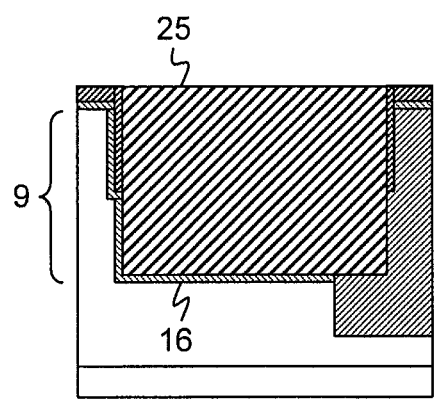
B

FIG.17
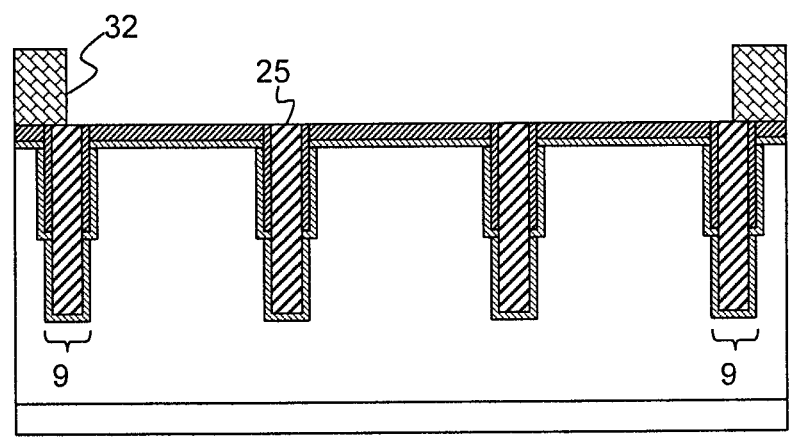
A
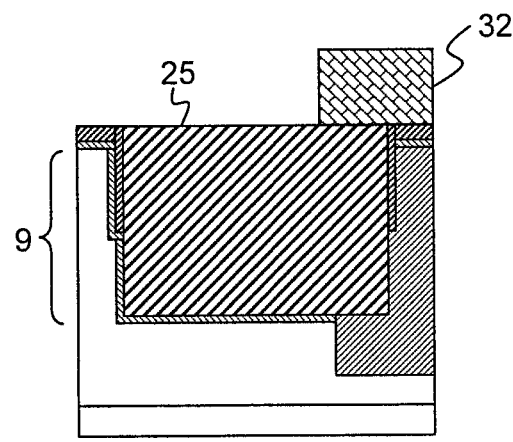
B

FIG.18
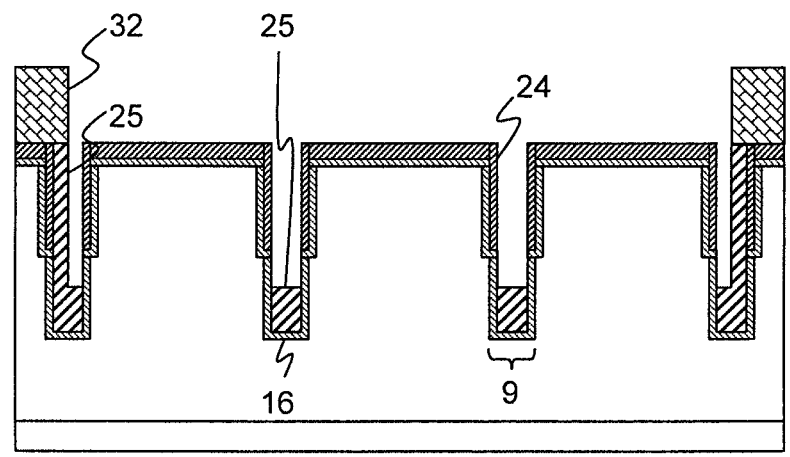
A
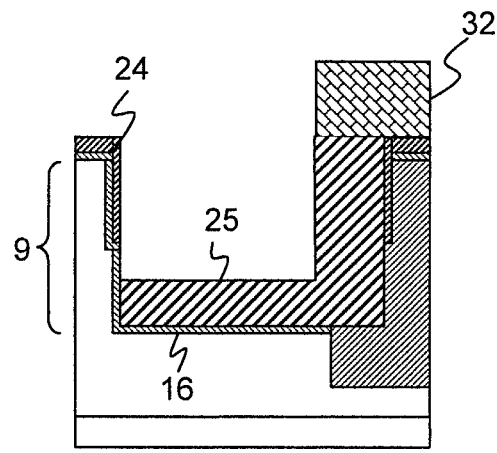
B

FIG.19
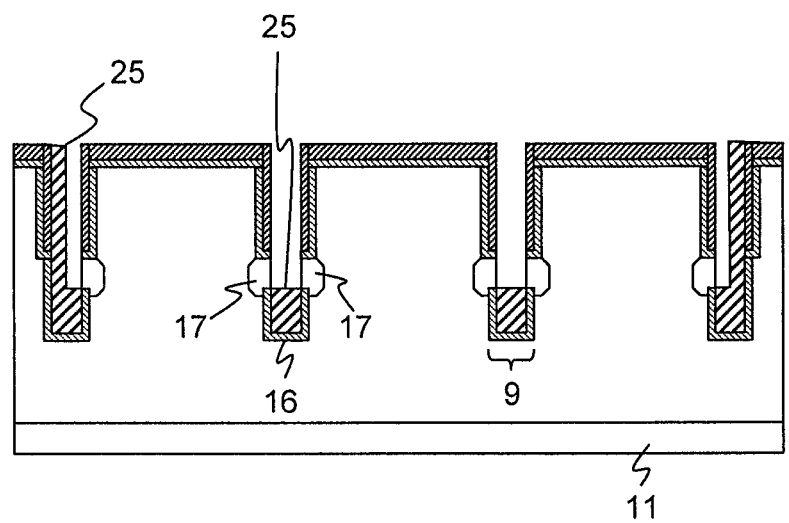
A
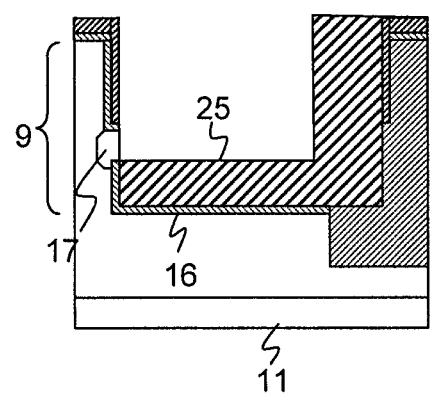
B

FIG.20
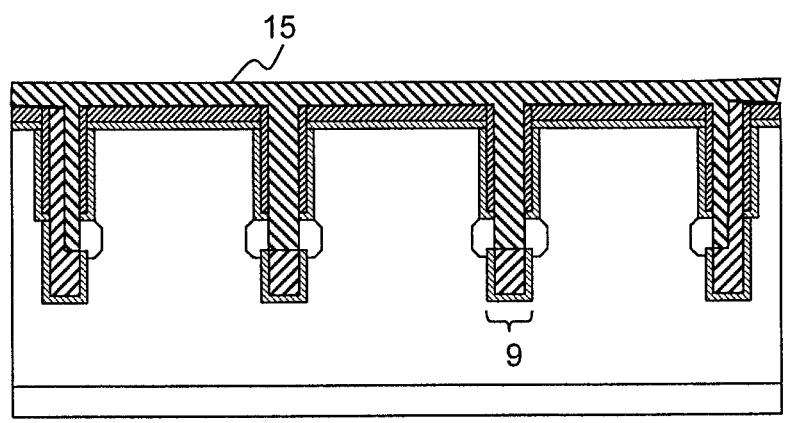
A
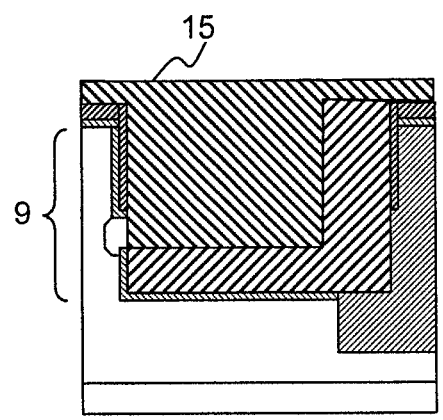
B

FIG.21
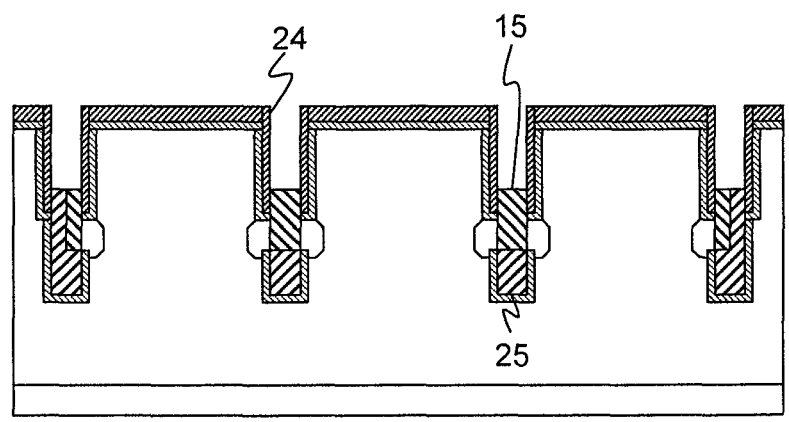
A
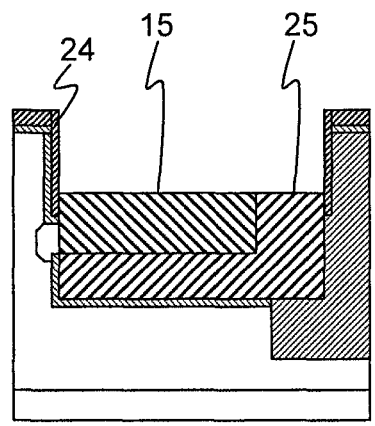
B

FIG.22
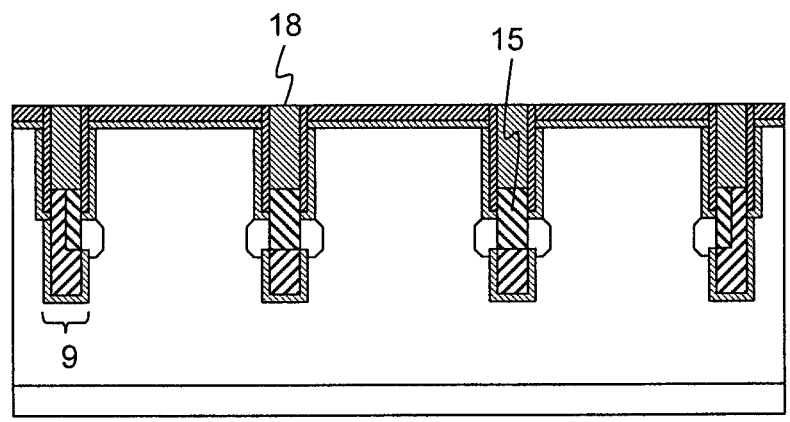
A
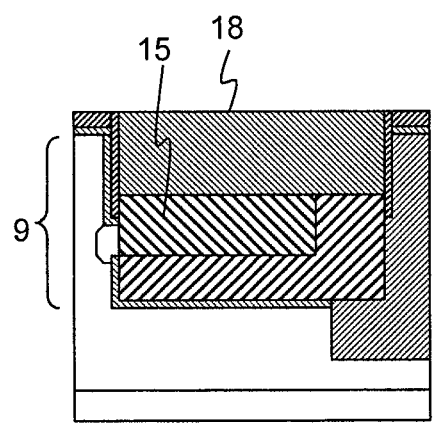
B

US 8,778,770 B2

SEMICONDUCTOR DEVICE AND METHOD FOR MANUFACTURING THE SAME

This application is based upon and claims the benefit of priority from Japanese Patent Application No. 2011-89194 filed on Apr. 13, 2011, the disclosure of which is incorporated herein in its entirety by reference.

BACKGROUND OF THE INVENTION

1. Field of the Invention

The present invention relates to a semiconductor device and a method of manufacturing the semiconductor device.

2. Description of the Related Art

It has been conventionally performed to feed a predetermined potential to a well, in order to prevent the potential of a well region from going into a floating state to cause a malfunction in a semiconductor device. FIG. 10 of US2004/125676 A1 and US2006/028853 A1 show a structure in which a p-type well layer is provided in a surface of a silicon substrate and a plurality of elements are disposed within an active region defined in the well layer by a trench isolation of an STI structure. In addition, US2004/125676 A1 and US2006/028853 A1 show a structure in which a high-concentration diffusion layer having the same polarity (p type) as the well layer is provided separately from the active region for element and power is fed from this diffusion layer to the well layer. In US2004/125676 A1 and US2006/028853 A1, the potential of the p-type well layer where respective elements are disposed is fixed by such a power feeding mechanism to the well.

SUMMARY OF THE INVENTION

In one embodiment, there is provided a semiconductor device comprising:
a well region formed in a surface of a semiconductor substrate;
a trench isolation formed in the surface of the semiconductor substrate to define an active region in the well region, a bottom of the trench isolation being positioned within the well region;
a conductive wiring formed in the trench isolation at the bottom thereof, the conductive wiring being electrically connected to the well region;
an insulating film which buries the conductive wiring in the bottom of the trench isolation; and
a semiconductor element disposed in the active region.

In another embodiment, there is provided a semiconductor device comprising:
a well region formed in a surface of a semiconductor substrate;
a conductive wiring which is disposed in a position within the well region deeper than the surface of the semiconductor substrate and fixes a potential of the well region;
an insulating film formed in a region from an upper surface of the conductive wiring to the surface of the semiconductor substrate;
an active region formed in the well region so as to be defined by the insulating film; and
a semiconductor element disposed in the active region.

In another embodiment, there is provided a method of manufacturing a semiconductor device, comprising:
forming a well region in a surface of a semiconductor substrate;
forming a trench in the well region so that a bottom of the trench is positioned within the well region; and
forming a conductive wiring in the trench so as to be electrically connected to the well region, and then forming an insulating film which buries the conductive wiring in the bottom of the trench, to form a trench isolation.

BRIEF DESCRIPTION OF THE DRAWINGS

The above features and advantages of the present invention will be more apparent from the following description of certain preferred embodiments taken in conjunction with the accompanying drawings, in which:

FIGS. 4 to 13 are cross-sectional views illustrating a manufacturing method of the first exemplary embodiment of the present invention;

FIG. 14 is a cross-sectional view illustrating a second exemplary embodiment of the present invention;

FIGS. 15 to 22 are cross-sectional views illustrating a manufacturing method of the second exemplary embodiment of the present invention;

Figure 1:
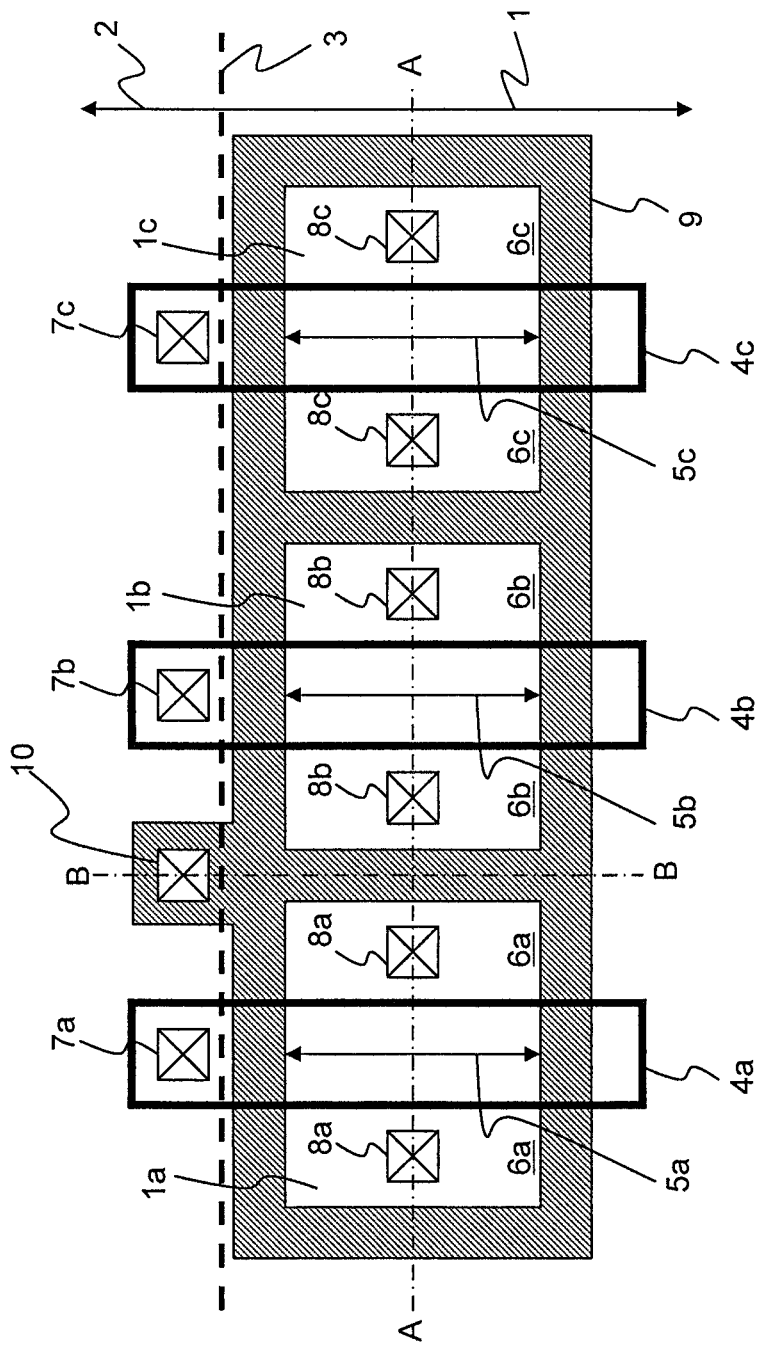
FIG. 1 is a plan view illustrating a first exemplary embodiment of the present invention.

In the drawings, numerals have the following meanings, 1: active region, 1a, 1b, 1c: MOS transistor region (active region), 2: isolation region, 3: boundary between active region and isolation region, 4, 4a, 4b, 4c, 56, 67: gate electrode, 5a, 5b, 5c: channel region, 6a, 6b, 6c: diffusion layer, 7a, 7b, 7c: gate contact, 8a, 8b, 8c: contact, 9, 72: well power-feeding region (trench portion), 9a: first trench (first opening), 10: power-feeding contact, 11: semiconductor substrate, 12: p-type well layer, 13a, 13b, 13c, 62, 68: gate insulating film, 14: interlayer insulating film, 15: conductive wiring, 16: bottom insulating film (second insulating film), 17: diffusion layer, 18: insulator (trench isolation), 19: shallow-trench isolation region, 20: gate oxide film, 21: silicon oxide film (mask), 22: silicon nitride film (mask), 23, 77, 81, 85, 88, 90: silicon oxide film, 24, 82: silicon nitride film (first insulating film), 25, 41: polycrystalline silicon, 26, 78: silicon nitride film, 32: resist mask, 42: titanium nitride film, 43: tungsten film, 50: cell transistor portion, 51: peripheral transistor portion, 52: buried bit line region, 53: pillar, 54: gate electrode (word line), 55: well power-feeding portion, 57: diffusion layer for source and drain, 58: contact, 59: channel portion, 60: bit line, 61: n-type diffusion layer, 63: second insulator, 64: first insulating film, 65: insulating film, 66: capacitor, 69: diffusion layer, 70: well layer, 71: trench, 73: diffusion layer, 74: bottom insulating film, 75: insulating material (trench isolation), 76: silicon substrate, 76a: p-type well layer, 76b: n-type well layer, 79: trench for buried bit line (second opening), 79a: second trench for buried bit line (third opening), 80: well power-feeding trench (first opening), 80a: second well power-feeding trench (trench portion), 83: buried bit line, 84: well power-feeding diffusion layer, 86, 87: polycrystalline silicon film, 89: mask, 91: p-type well layer, 92:

well power-feeding portion, 93: n-type well region, 94: n-type deep well layer, and 95: well power-feeding trench.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

A semiconductor device comprises a well region, a trench isolation, a conductive wiring, an insulating film, and a semiconductor element. The well region is formed in a surface of a semiconductor substrate. The trench isolation is formed in the surface of the semiconductor substrate to define an active region in the well region. The bottom of the trench isolation is positioned within the well region. The conductive wiring is formed in the trench isolation at the bottom thereof, and is electrically connected to the well region. The insulating film buries the conductive wiring in the bottom of the trench isolation. The semiconductor element is disposed in the active region In a method of manufacturing the semiconductor device, a trench is formed in a well region so that a bottom of the trench is positioned within the well region after the well region is formed in the surface of the semiconductor substrate. A conductive wiring is formed in the trench so as to be electrically connected to the well region, and then, an insulating film is formed so that it buries the conductive wiring in the bottom, thereby forming a trench isolation.

As described above, since the trench isolation includes the insulating film for burying the conductive wiring in the bottom of the trench isolation, it is possible to reduce the area of the well power-feeding region and miniaturize the semiconductor device. In case of feeding power to a plurality of active regions, power is fed to the well region in contact with the bottom of the trench isolation. Consequently, it is possible to suppress well potential variations among the active regions. In addition, since the active regions are electrically isolated from one another by the insulating film, it is possible to reduce the width of the trench isolation.

First Exemplary Embodiment

A semiconductor device of the present exemplary embodiment in which a plurality of n-channel MOS transistors are manufactured will be explained with reference to FIGS. 1 to 3. In the present exemplary embodiment, as illustrated in FIG. 1, well power-feeding regions 9 shown by a shaded area is disposed, so as to surround MOS transistor regions (active regions) 1a, 1b and 1c formed in active region 1, when viewed planarly. Power feeding to well power-feeding regions 9 is performed through contact 10. In addition, parts of well power-feeding regions 9 are also disposed in isolation region 2. In FIG. 1, boundary 3 between active region 1 and isolation region 2 is shown by a dashed line.

Gate electrodes 4a, 4b and 4c made of an n-type polycrystalline silicon film, a titanium nitride film and a tungsten film are disposed in MOS transistor regions 1a, 1b and 1c, respectively. p-type channel regions 5a, 5b and 5c are formed in transistor regions 1a, 1b and 1c, respectively. n-type diffusion layers 6a, 6b and 6c serving as sources and drains are formed in portions of transistor regions 1a, 1b and 1c where gate electrodes 4a, 4b and 4c are not present, respectively. Power feeding to gate electrodes 4a, 4b and 4c is performed through gate contacts 7a, 7b and 7c, respectively, provided in isolation region 2. In addition, power feeding to n-type diffusion layers 6a, 6b and 6c serving as sources and drains is performed through contacts 8a, 8b and 8c, respectively.

Figure 2:
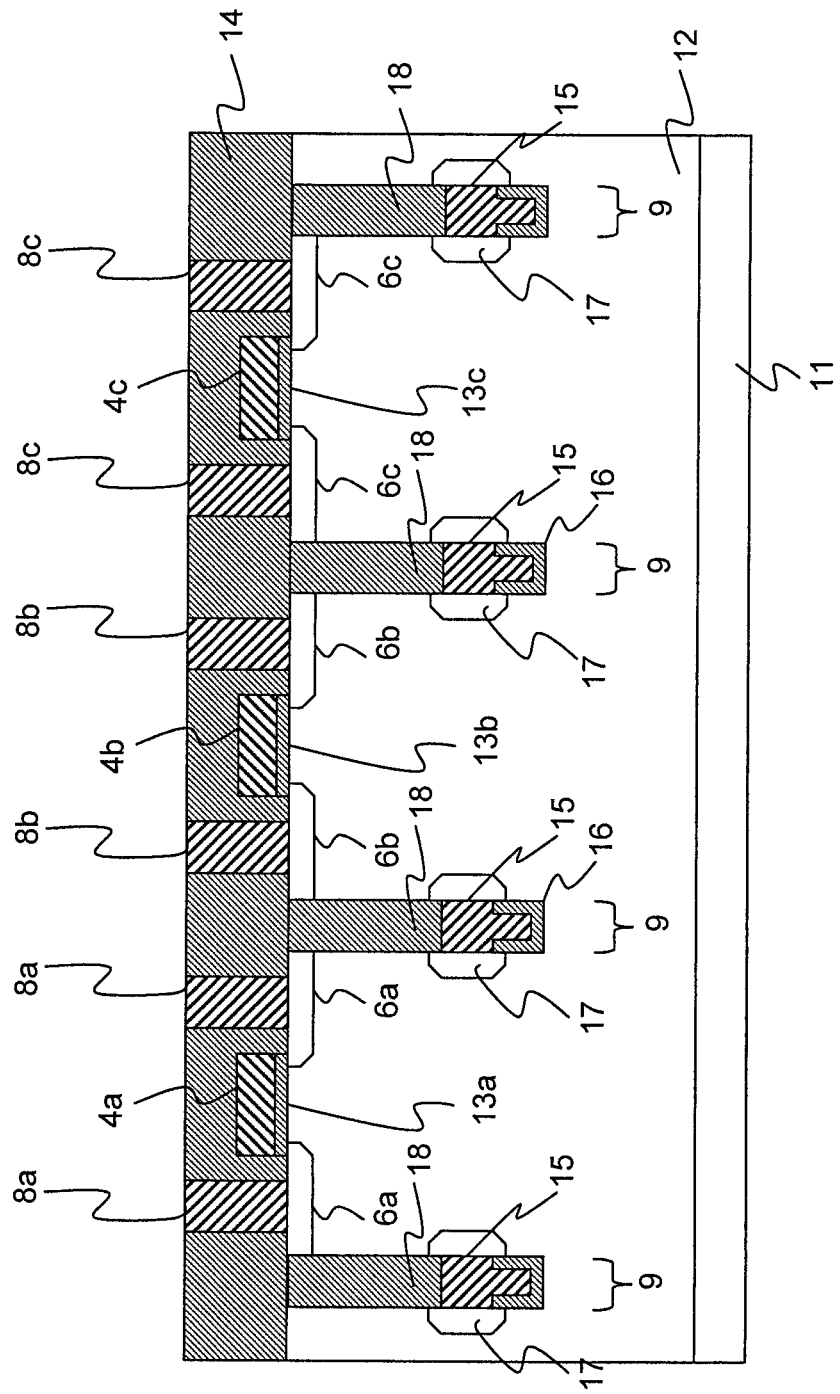
FIG. 2 is a cross-sectional view illustrating a transistor portion of the first exemplary embodiment of the present invention.

Also in the present exemplary embodiment, as illustrated in FIG. 2 which is the A-A cross section of FIG. 1, trench isolations 9 positioned between transistors are formed in p-type well layer 12 formed on the main surface side of semiconductor substrate 11. In the present exemplary embodiment, trench portions 9 will be explained as one example of trench isolation 9. Each trench portion 9 is formed downwardly from the surface of semiconductor substrate 11 in the thickness direction thereof and defines a part (an active region) in p-type well layer 12. Conductive wiring 15 made of p-type polycrystalline silicon is buried in the bottom of each trench portion 9. In addition, p-type regions (diffusion layers) 17 are formed between conductive wirings 15 and semiconductor substrate 11 including p-type well layer 12. An impurity having the same conductivity type 12 as the p-type well layer is implanted into each p-type region 17 at a high concentration.

Each conductive wiring 15 is electrically connected to p-type well layer 12 through an inner side surface of each trench portion 9. That is, power feeding to p-type well layer 12 is performed from conductive wirings 15 through diffusion layers 17 within p-type well layer 12. Each diffusion layer 17 is provided continuously, so as to make a circuit of an outer circumference of p-type well layer 12 defined by each trench portion 9. In addition, the inner side surface of each trench portion 9 in contact with each diffusion layer 17 also surrounds p-type well layer 12 by making a circuit of the outer circumference thereof. Insulating film 18 is buried on conductive wiring 15 within each trench portion 9, and this insulating film 18 functions to isolate elements. Bottom insulating film 16 is formed on the inner bottom surface of each trench portion 9, and it also functions to provide an isolation between MOS transistors.

Transistors (semiconductor elements) comprise n-type diffusion layers 6a, 6b and 6c for sources and drains, gate insulating films 13a, 13b and 13c made of a silicon oxide film, gate electrodes 4a, 4b and 4c made of the above-described laminated film, and contacts 8a, 8b and 8c formed within interlayer insulating film 14 made of a silicon oxide film.

Figure 3:
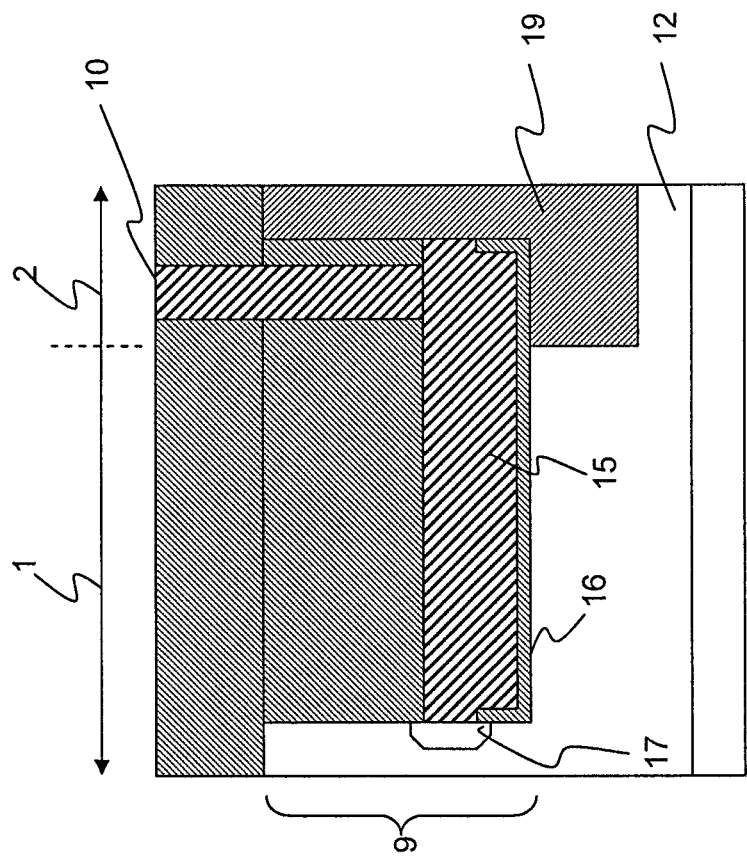
FIG. 3 is a cross-sectional view illustrating a well power-feeding contact of the first exemplary embodiment of the present invention.

In the present exemplary embodiment, as illustrated in FIG. 3 which is the B-B cross section of FIG. 1, trench portion 9 which includes conductive wiring 15 buried in active region 1 is formed, so as to extend up to shallow-trench isolation region 19 of isolation region 2. In addition, conductive wiring 15 is also formed extendedly up to shallow-trench isolation region 19, and contact 10 for feeding power to conductive wiring 15 is formed above shallow-trench isolation region 19. Bottom insulating film 16 is formed in the bottom of trench portion 9. Conductive wiring 15 is in contact with diffusion layers 17 provided within p-type well layer 12.

The conductive wiring 15 can include material selected from the group consisting of polycrystalline silicon in which an impurity having the same conductivity type as the p-type well layer 12 is doped, silicide containing refractory metal, and a laminated film of a barrier metal layer and a metal layer.

The manufacturing method of semiconductor device described above will be described in more detail with reference to FIGS. 4 to 13. Drawings A and B in FIG. 4 and subsequent figures represent cross-sectional views corresponding respectively to the A-A cross section and the B-B cross section shown in FIG. 1.

First, as illustrated in FIG. 4, shallow-trench isolation region 19 having a depth of 300 nm was formed in the main surface of silicon substrate 11. This shallow-trench isolation region 19 was formed by etching silicon substrate 11 to form a trench and burying a silicon oxide film in the trench. This manufacturing method is a usual method, and therefore, details on the method will be omitted here. Next, boron was doped in a region of silicon substrate 11 from 0 to 500 nm-depth at a concentration of approximately $1\times10^{17}/cm^3$ to $3\times10^{17}/cm^3$ to form p-type well layer 12. The abovementioned boron dope is performed by means of usual ion implantation. The formation of p-type well layer 12 having the abovementioned concentration can be realized using various combinations of ion implantation conditions (energy and dose amount). Accordingly, details on the conditions will not be explained here.

Next, as illustrated in FIG. 5, thin (5 nm) silicon oxide film 21 was formed by thermal oxidation and, then thick (35 nm) silicon nitride film 22 was formed by a CVD method, thereby forming mask made of silicon oxide film 21 and silicon nitride film 22. By etching silicon substrate 11 using the mask, first trenches (first openings) 9a were formed within p-type well layer 12. At this time, first trenches 9a had a width of 50 nm and a depth of 100 nm. First trenches 9a had a predetermined depth in order to isolate the abovementioned MOS transistors from one another. A part of each first trench 9a extended to the shallow-trench isolation region 19.

Next, as illustrated in FIG. 6, silicon oxide film 23 having a thickness of 5 nm was formed on the inner surfaces of first trenches 9a by thermal oxidation. Subsequently, as a first insulating film, silicon nitride film 24 having a thickness of 5 nm was formed by a CVD method. After this, sidewall layers made of silicon oxide film 23 and silicon nitride film 24 were formed on the inner side surfaces of first trenches 9a by etch-back of them. After that, second trenches (trench portions) 9 deeper than first trenches 9a were formed by etching silicon substrate 11 using silicon nitride film 24 of these sidewall layers as a mask. Here, the second trenches 9 had a width of 40 nm, and an additional depth by which second trenches 9 were made deeper than first trenches 9a was set to 100 nm. As a result, the overall depth of second trenches 9 was set to 200 nm. A part of each second trench 9 extended to shallow-trench isolation region 19.

Next, as illustrated in FIG. 7, as a second insulating film, silicon oxide film 16 having a thickness of 5 nm was formed on the inner surfaces of second trenches 9 by a thermal oxidation method. Subsequently, polycrystalline silicon 25 which was the material of the abovementioned first conductive wiring, was deposited using a CVD method. After that, an upper surface of the first conductive wiring material 25 was recessed to a position deeper than the deepest position of the formed silicon nitride film 24 by dry etching. Here, the upper surface of the first conductive wiring material 25 was recessed to a position deeper by 50 nm than the deepest position of the silicon nitride film 24.

Next, as illustrated in FIG. 8, a part of silicon oxide film (second insulating film) 16 was removed to expose silicon substrate 11. At this time, silicon nitride film 24 and polycrystalline silicon 25 remained without being removed due to a difference in etching rate between silicon oxide film 16, and films 24 and 25. Subsequently, boron was doped into the exposed portion of silicon substrate 11 and polycrystalline silicon 25 by a usual plasma doping method, thereby transforming polycrystalline silicon 25 into parts of the conductive wirings and forming p-type diffusion layers 17 in silicon substrate 11. Here, a boron concentration was set to approximately $1\times10^{20}/cm^3$, and the lateral spread of boron was set to approximately 10 nm.

Next, as illustrated in FIG. 9, polycrystalline silicon 15 was deposited (50 nm in film thickness) using a CVD method and was buried in second trenches 9. After this, boron was doped under the condition of 5 keV and $1\times10^{15}$ atoms/cm$^2$, and was diffused into polycrystalline silicon 25 in the bottom of the second trench 9 by a heat treatment of 1000° C. for 10 second. Subsequently, an upper surface of p-type polycrystalline silicon 15 was recessed to a position shallower than the deepest position of the formed silicon nitride film 24 by dry etching, thereby completing conductive wiring 15. Here, the upper surface of polycrystalline silicon 15 was recessed to a position 30 nm above the deepest position of silicon nitride film 24. The isolation capability is improved more than described above by reducing the recession amount of polycrystalline silicon 15, for example, by recessing polycrystalline silicon 15 to a position 50 nm above the deepest position of silicon nitride film 24. However, if the recession amount is excessively reduced, n-type diffusion layers 6 of a transistor to be formed later and p-type polycrystalline silicon 15 come closer to each other, thus increasing GIDL. For this reason, the recession amount needs to be set depending on the depth of n-type diffusion layers 6. For example, it is appropriate to recess the upper surface of polycrystalline silicon 15 to a position 20 nm or deeper than the deepest position of n-type diffusion layers 6.

Next, as illustrated in FIG. 10, silicon oxide (insulating film) 18 was buried by a CVD method, so as to completely fill second trench 9, and then planarized by CMP. In the way described above, conductive wiring 15 was formed, and then insulating film 18 was formed on conductive wiring 15.

After that, as illustrated in FIG. 11, the mask including thin (10 nm) silicon oxide film 21 and thick (100 nm) silicon nitride film 22 (not illustrated in FIG. 11) was removed. After this, gate oxide film 20 having a thickness of 2 nm was formed on the surface of silicon substrate 11 by thermal oxidation, as a gate insulating film. Subsequently, gate electrode 4 including of n-type polycrystalline silicon film 41 (50 nm), titanium nitride film 42 (5 nm) and tungsten film 43 (50 nm) was formed by a CVD method. Phosphorous was doped into n-type polycrystalline silicon 41 at a dose amount of $4\times10^{20}/cm^3$.

Next, as illustrated in FIG. 12, gate electrode 4 was processed by dry etching using silicon nitride film 26 (50 nm-thick) formed on gate electrode 4 as a mask. After this, silicon oxide film having a thickness of 5 nm (not illustrated) was formed on the sidewalls of gate electrodes 4 by a CVD method. After this, arsenic was doped into silicon substrate 11 under the condition of 15 keV and $1\times10^{15}$ atoms/cm$^2$. Next, n-type diffusion layers 6 serving as sources and drains were formed by a heat treatment of 900° C. for 10 second.

Next, as illustrated in FIG. 13, as interlayer insulating film 14, a silicon oxide film having a thickness of 300 nm was deposited by a CVD method. After this, contact holes were formed by a usual photo-etching technique. Next, metal was buried in these holes by a CVD method to form contacts 7 (not illustrated), 8 and 10. At the time of burying metal in the contact holes 7, 8 and 10, first, titanium film having a thickness of 5 nm was buried, next, titanium nitride film having a thickness of 5 nm was buried, and last, tungsten film having a thickness of 50 nm was buried. After this, these metal films were planarized by CMP using silicon oxide film 14 as a stopper to form contacts 7, 8 and 10. Contacts 8 are ones for sources/drains, contact 7 is one for a gate electrode, and contact 10 is one for feeding power to a well from trench-buried conductive wiring 15 formed within shallow-trench isolation region 19. After that, conductive wirings (not illustrated) were connected to respective contacts 7, 8 and 10, thereby manufacturing desired semiconductor elements.

As described above, according to the present exemplary embodiment, well power-feeding regions 9 can be provided between transistors. Consequently, it is possible to eliminate an area necessary for isolation between active region 1 and well power-feeding regions 9, and an area necessary for well power-feeding regions 9. In this case, however, an area for forming well power-feeding contact 10 above shallow-trench isolation region 19 has need to be secured. However, since the area is small, compared with the areas that are no longer needed, this does not matter.

In addition, if isolation between transistors is performed with a shallow-trench isolation region formed by STI or the like, trench having a width of 100 nm is required for reasons of the burying characteristics of an insulating film, when the shallow-trench isolation region has a depth of 300 nm. That is, the shallow-trench isolation region needs to have a width of 100 nm. Here, regarding the burying characteristics of an insulating film, a determination was made that it could be buried in the trench when an aspect ratio was 3 or lower.

In contrast, in the present exemplary embodiment, the upper surfaces of conductive wirings 15 were positioned at a depth of 70 nm from the surface of silicon substrate 11. In addition, the thickness of a mask for forming second trenches 9 is 40 nm in total. Consequently, insulating films 18 were buried onto conductive wirings 15 in trenches 9 having a width of 40 nm, a depth of 110 nm, and an aspect ratio of 3 or lower. Since a width of the initial first trenches 9a was 50 nm in the present exemplary embodiment, the width of isolation between transistors was 50 nm. Accordingly, the width of isolation can be reduced to approximately half the width of shallow-trench isolation region 19. In addition, since each conductive wiring 15 for power feeding to the well is positioned so as to surround a transistor, the resistance of the conductive wiring 15 becomes approximately one-tenth of well resistance depending on well concentration, thereby reducing effects of noise.

In the present exemplary embodiment, p-type well layer 12 has been cited and described as an example of a well layer defined by trench portion 9. Alternatively, the well layer defined by trench portion 9 may be an n-type well layer. In this case, diffusion layers 17 are also specified as being of n-type, which is the same as the conductivity type of the well layer. In addition, FIG. 1 shows simply one example of the layout of well power-feeding regions 9 and well layer 12. The layout of well power-feeding regions 9 and well layer 12 is therefore not limited to the one illustrated in FIG. 1.

Second Exemplary Embodiment

In the above-described first exemplary embodiment, diffusion layers 17 having the same conductivity type as a well were formed in contact with both side surfaces of each well power-feeding region 9, as illustrated in FIG. 2. In contrast, as illustrated in FIG. 14, a second exemplary embodiment differs from the first exemplary embodiment in that, diffusion layers 17 having the same conductivity type as a well are formed only in contact with one side surface of each well power-feeding region 9 at both ends.

Hereinafter, a manufacturing process of the present exemplary embodiment will be described. Each structure is functionally the same as that of the first exemplary embodiment, and therefore, will not be discussed here.

First, steps of FIGS. 1-6 described in the first exemplary embodiment are the same in the present embodiment.

Next, as illustrated in FIG. 15, as a second insulating film, silicon oxide film 16 having a thickness of 5 nm was formed on the inner surfaces of second trenches 9 by a thermal oxidation method. Subsequently, as the abovementioned first conductive wiring material, polycrystalline silicon 25 having a thickness of 50 nm was deposited by a CVD method, and was planarized by CMP.

Figure 16:
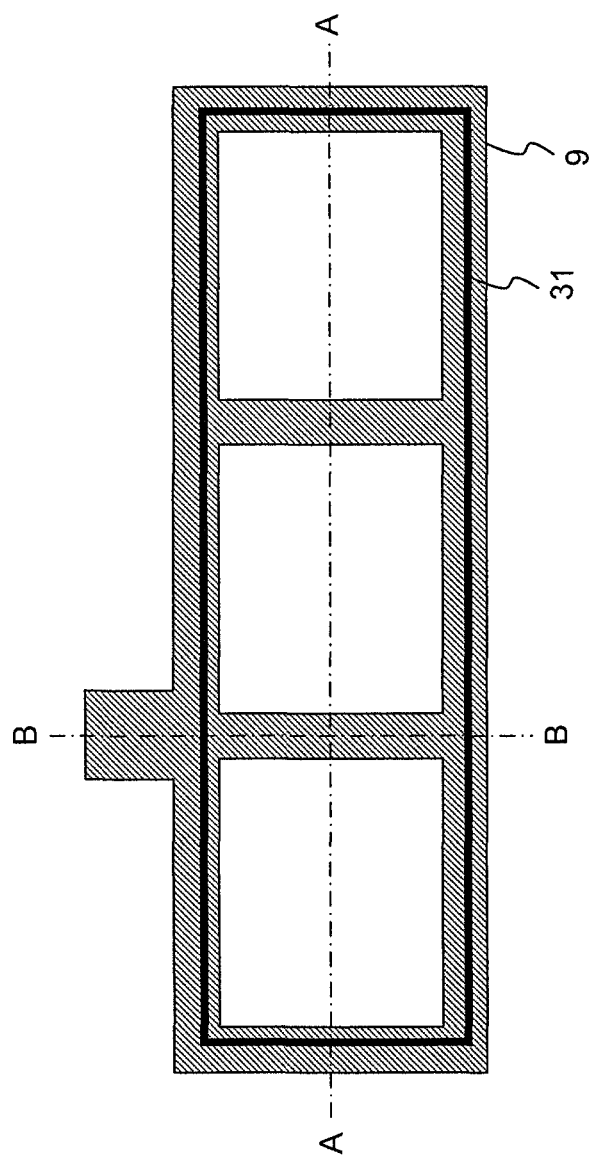

Next, as illustrated in the plan view of FIG. 16, a resist mask in which an area surrounded by thick solid line 31 in the figure was opened, was formed by a usual photolithographic technique. Specifically, as illustrated in the cross-sectional views of FIG. 17, resist mask 32 was formed. As illustrated in FIGS. 16 and 17, this resist mask 32 had an opening above a part of an upper surface of first conductive wiring material 25 in second trenches 9 at both ends, and had an opening above the entire surfaces of first conductive wiring material 25 in the other second trenches 9.

Next, as illustrated in FIG. 18, upper surfaces of first conductive wiring material 25 in portions where resist mask 32 was not present, were recessed to a position deeper than the deepest position of the formed silicon nitride film 24, by anisotropic dry etching. Here, upper surfaces of first conductive wiring material 25 were recessed to a position deeper by 50 nm than the deepest position of the formed silicon nitride film 24. At this time, only parts of the upper surfaces of first conductive wiring material 25 were recessed for second trenches 9 at both ends, and the entire surfaces of first conductive wiring material 25 were recessed for other second trenches 9. Consequently, only a portion of silicon oxide film 16 provided on one of two inner side surfaces opposite to each other became exposed for second trenches 9 at both ends. On the other hand, portions of silicon oxide film 16 provided on two inner side surfaces opposite to each other became exposed for other second trenches 9.

Next, as illustrated in FIG. 19, the exposed silicon oxide film 16 was removed to expose silicon substrate 11. At this time, only a portion of silicon oxide film 16 provided on one inner side surface was removed for second trenches 9 at both ends. Thus, only a portion of silicon substrate 11 composing this one inner side surface became exposed. On the other hand, portions of silicon oxide film 16 provided on the two inner side surfaces opposite to each other were removed for other second trenches 9. Thus, portions of silicon substrate 11 composing the two inner side surfaces became exposed. Subsequently, boron was doped into the exposed portions of silicon substrate 11 and polycrystalline silicon 25 by a usual plasma doping method, thereby transforming polycrystalline silicon 25 into a part of a conductive wiring and forming p-type diffusion layers 17 in silicon substrate 11. Here, a boron concentration was approximately $1 \times 10^{20}/cm^3$, and the lateral spread due to diffusion was approximately 10 nm.

Next, as illustrated in FIG. 20, polycrystalline silicon 15 (50 nm in film thickness) was deposited by a CVD method and was buried in second trenches 9. After this, boron was doped into the polycrystalline silicon 15 under the condition of 5 keV and $1 \times 10^{15}$ atoms/cm$^2$, and was diffused into bottoms of the second trenches 9 by heat treatment of 100° C. for 10 seconds.

Next, as illustrated in FIG. 21, upper surfaces of p-type polycrystalline silicon 15 and polycrystalline silicon 25 were simultaneously recessed to a position shallower than the deepest position of the silicon nitride film 24 by dry etching, thereby completing the conductive wiring. Here, upper surfaces of polycrystalline silicon 15 were recessed to a position 30 nm above the deepest position of silicon nitride film 24. The isolation capability is improved more than described above by reducing the recession amount of polycrystalline silicon 15, for example, by recessing upper surfaces of polycrystalline silicon 15 to a position 50 nm above the deepest position of silicon nitride film 24. If the recession amount is excessively reduced, however, n-type diffusion layers 6 to be formed later and p-type polycrystalline silicon 15 come closer to each other, thus increasing GIDL. For this reason, the recession amount needs to be set depending on the depth of n-type diffusion layers 6. For example, it is appropriate to recess upper surfaces of polycrystalline silicon 15 to a position 20 nm or deeper than the depth of n-type diffusion layers 6.

Next, as illustrated in FIG. 22, silicon oxide 18 was buried in the second trenches 9 by a CVD method, so as to completely fill second trenches 9, and then planarized by CMP. In the way described above, conductive wirings 15 were formed, and then insulating films 18 were formed on conductive wirings 15.

Subsequent steps were the same as the steps of FIGS. 11 to 13 discussed in the above-described first exemplary embodiment.

As described above, according to the present exemplary embodiment, there is produced the effect of reducing an area by as much as the area of diffusion layers 17 having the same conductivity type as a well region, in addition to the advantageous effects of the first exemplary embodiment.

Third Exemplary Embodiment

Hereinafter, a description will be given of a third exemplary embodiment. In the present exemplary embodiment, the present invention is applied to a structure and a process in which buried bit line 60 of a cell transistor and a well power-feeding region of a peripheral transistor in a DRAM are simultaneously manufactured.

Figure 23:
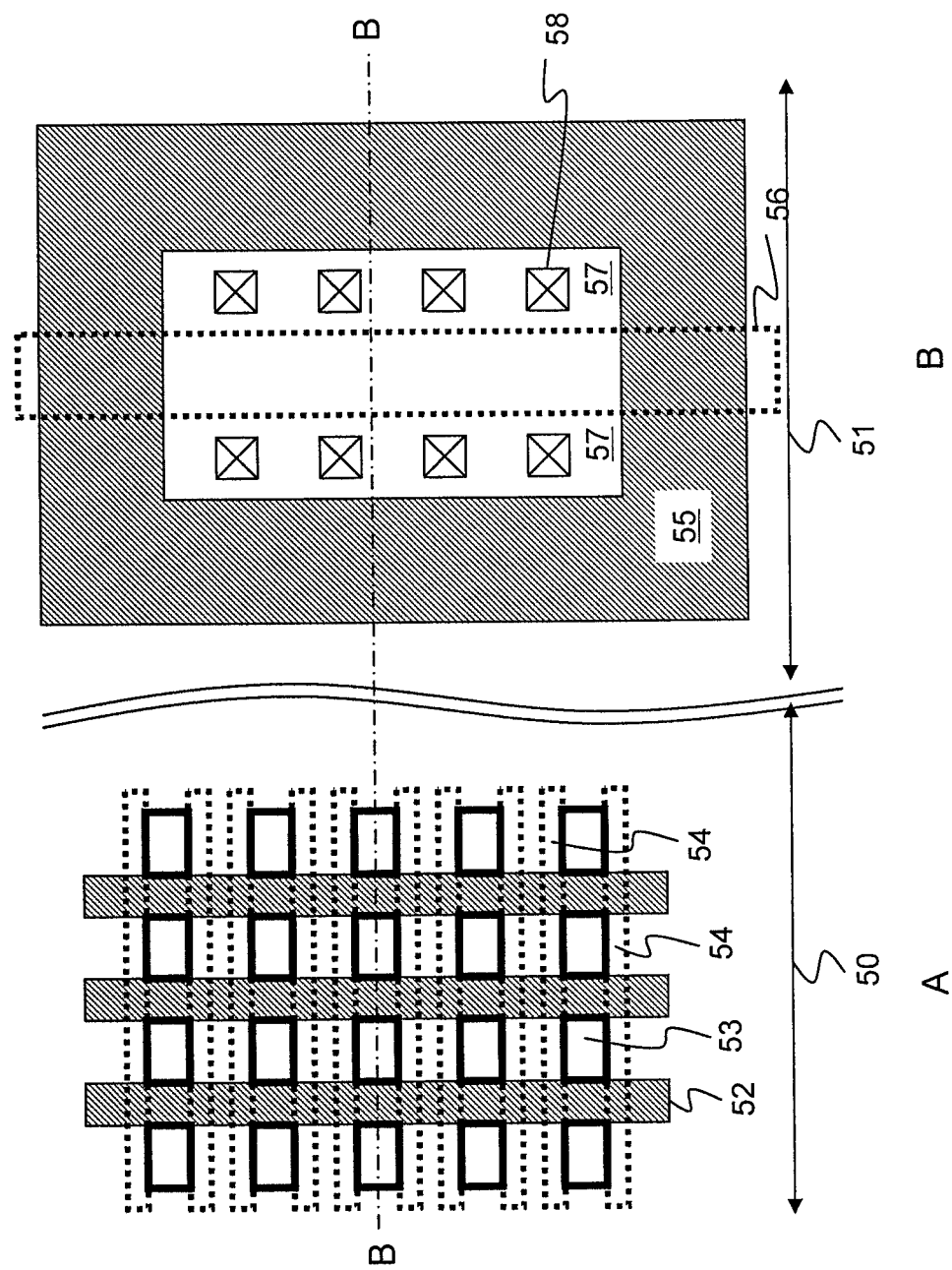
FIGS. 23 and 24 are plan views illustrating a third exemplary embodiment of the present invention.

First, FIG. 23 illustrates a plan view taken by extracting typical structural parts of cell transistor portion 50 and peripheral transistor portion 51. Cell transistor portion 50 comprises buried bit line regions 52, pillars 53 (shown by a rectangular thick line) in which channels of cell transistors are formed, and gate electrodes 54 (word lines 54 shown by a dashed line) of the cell transistors. On the other hand, peripheral transistor portion 51 comprises a trench-buried well power-feeding portion 55, a gate electrode 56, diffusion layers 57 for sources and drains of a planar MOS transistor, and contacts 58 for contacting with diffusion layers 57.

Figure 24:
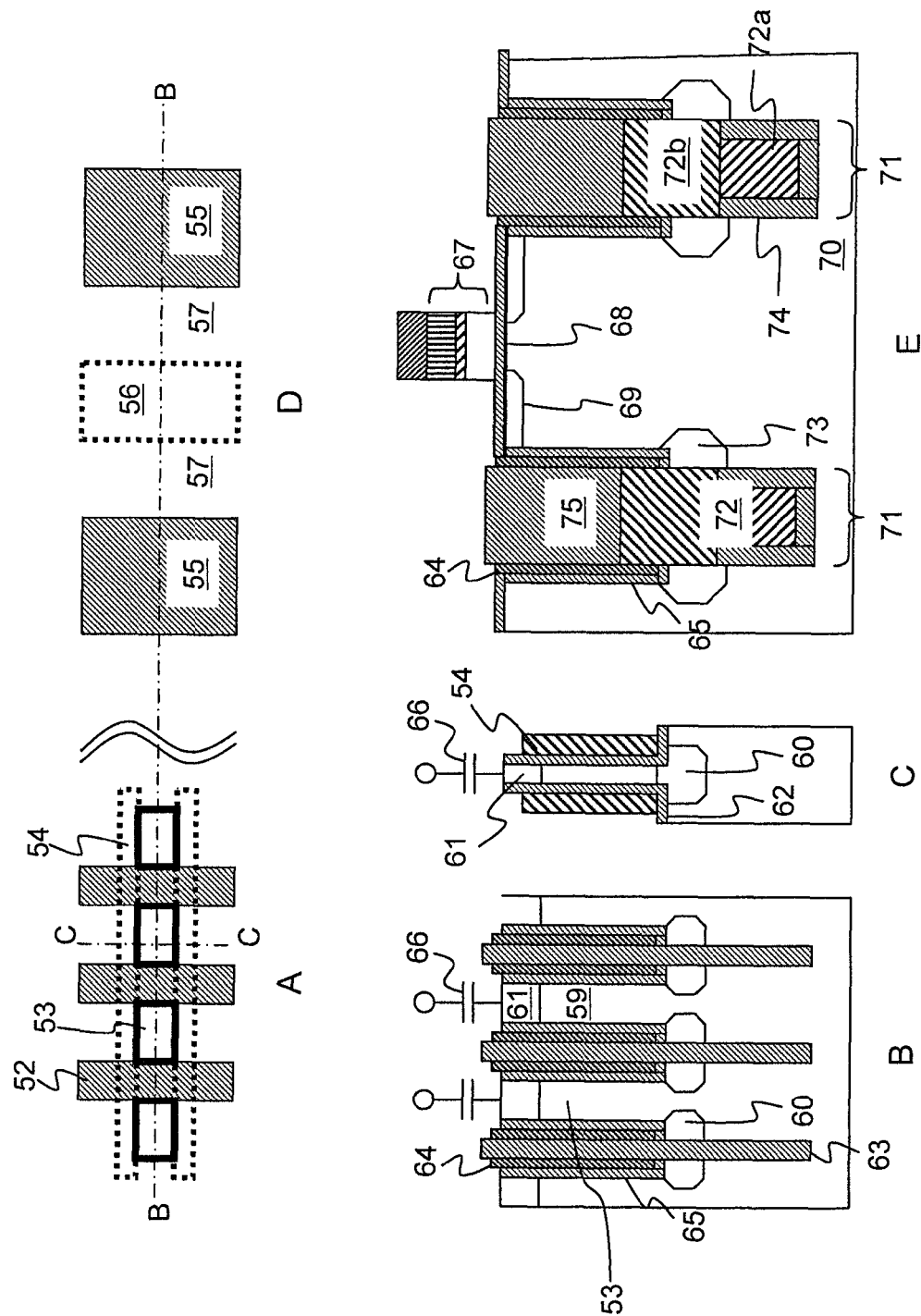

FIG. 24 illustrates the B-B cross-sectional view of a plan view shown in FIG. 23. By showing the B-B cross-sectional view of FIG. 24A in FIG. 24B and the C-C cross-sectional view of FIG. 24A in FIG. 24C, first, FIGS. 24A and 24D are partially enlarged views of FIG. 23. The structure of the cell transistor will be described. The cell transistors are vertical MOS transistors. Each cell transistor comprises a channel portion 59 in pillar 53, diffusion layers 60 for buried bit lines 52 formed in the lower portion of channel portion 59, a diffusion layer 61 formed in the upper portion of channel portion 59, a gate insulating film 62 surrounding the pillar 53, and gate electrodes 54 (word lines 54) formed on the sidewalls of the pillar 53.

As illustrated in FIG. 24B, diffusion layers 60 for buried bit lines of each cell transistor are isolated by second insulator 63 buried in a trench. In addition, channel portion 59 of each transistor is isolated by second insulators 63, first insulating films 64 buried in a trench, and insulating films 65 on the sidewalls of pillar 53. In addition, as illustrated in FIG. 24C, gate electrodes 54 (word lines 54) of each transistor is isolated by a first insulator, though not illustrated. As illustrated in FIGS. 24B and 24C, diffusion layer 61 in the upper portion of each transistor is connected to capacitor 66 for accumulating electric charges.

As illustrated in FIG. 24D, the peripheral transistor portion includes trench-buried well power-feeding portions 55, a gate electrode 56, and diffusion layers 57 for sources and drains.

Here, by showing the B-B cross-sectional view of FIG. 24D in FIG. 24E, the structure of the peripheral transistor will be described. The peripheral transistor comprises a gate electrode 67, a gate insulating film 68, and diffusion layers 69, and is formed in the upper portion of well layer 70 opposite in conductivity type to diffusion layers 69. The potential of well layer 70 is supplied through diffusion layers 73 having the same conductivity type as a well layer 70. The diffusion layers 73 are in contact with well power-feeding electrodes 72 buried in trenches 71 formed so as to surround the transistor. Each well power-feeding electrode 72 comprises a region 72a surrounded by bottom insulating film 74 formed in the bottom of trench 71 and a region 72b in contact with the diffusion layers 73.

In addition to first insulator 64 and insulating film 65 buried in the trench 71 described with regard to the cell transistor structure, insulating film 75 is formed in portions of trenches 71 upper than the well power-feeding electrode 72. In addition, contact with diffusion layers 69 is made through a contact formed in the interlayer insulating film, though this is not illustrated in FIG. 24E.

Figure 25:
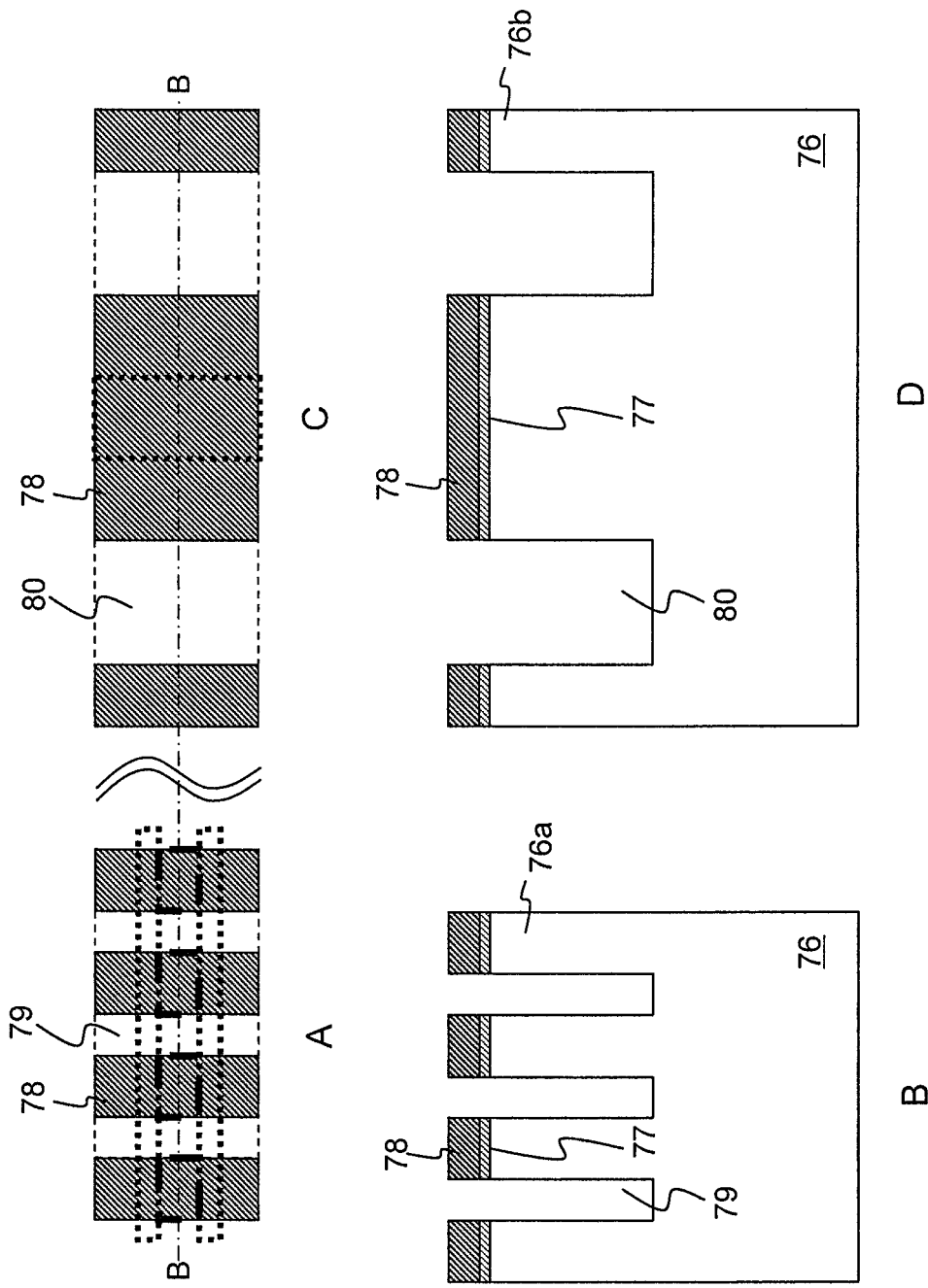
FIGS. 25 to 43 are cross-sectional views illustrating a manufacturing method of the third exemplary embodiment of the present invention.

A manufacturing process according to the above-described third exemplary embodiment will be described hereinafter. In FIG. 25 and subsequent figures, Drawings A and B represent plan views and cross-sectional views of the cell transistor portion, respectively. Drawings C and D represent plan views and cross-sectional views of the peripheral transistor portion, respectively.

First, as illustrated in FIG. 25, silicon oxide film 77 having a thickness of 10 nm was formed on a surface of silicon substrate 76 by thermal oxidation. Next, silicon nitride film 78 having a thickness of 100 nm was formed by a CVD method. Then, silicon nitride film 78 and silicon oxide film 77 were processed by a usual photo-etching technique, so that an buried bit line region and a trench-buried well power-feeding portion to be formed later became exposed. After this, trenches (second opening) 79 for buried bit lines and well power-feeding trenches (first opening) 80 were formed within silicon substrate 76 by dry etching using silicon oxide film 77 and silicon nitride film 78 as a processing mask. Here, the width and depth of trenches 79 for buried bit lines were set to 50 nm and 150 nm, respectively. In addition, the width and depth of well power-feeding trenches 80 was set to 120 nm and 150 nm, respectively. P-type well layer 76a having a depth of approximately 1 μm and a concentration of approximately $1 \times 10^{17}/cm^3$ was formed on the front surface side of silicon substrate 76 of the cell transistor portion. In addition, n-type well layer 76b having a depth of approximately 1.2 μm and a concentration of approximately $3 \times 10^{17}/cm^3$ was formed on the front surface side of the silicon substrate 76 of the peripheral transistor portion.

Figure 26:
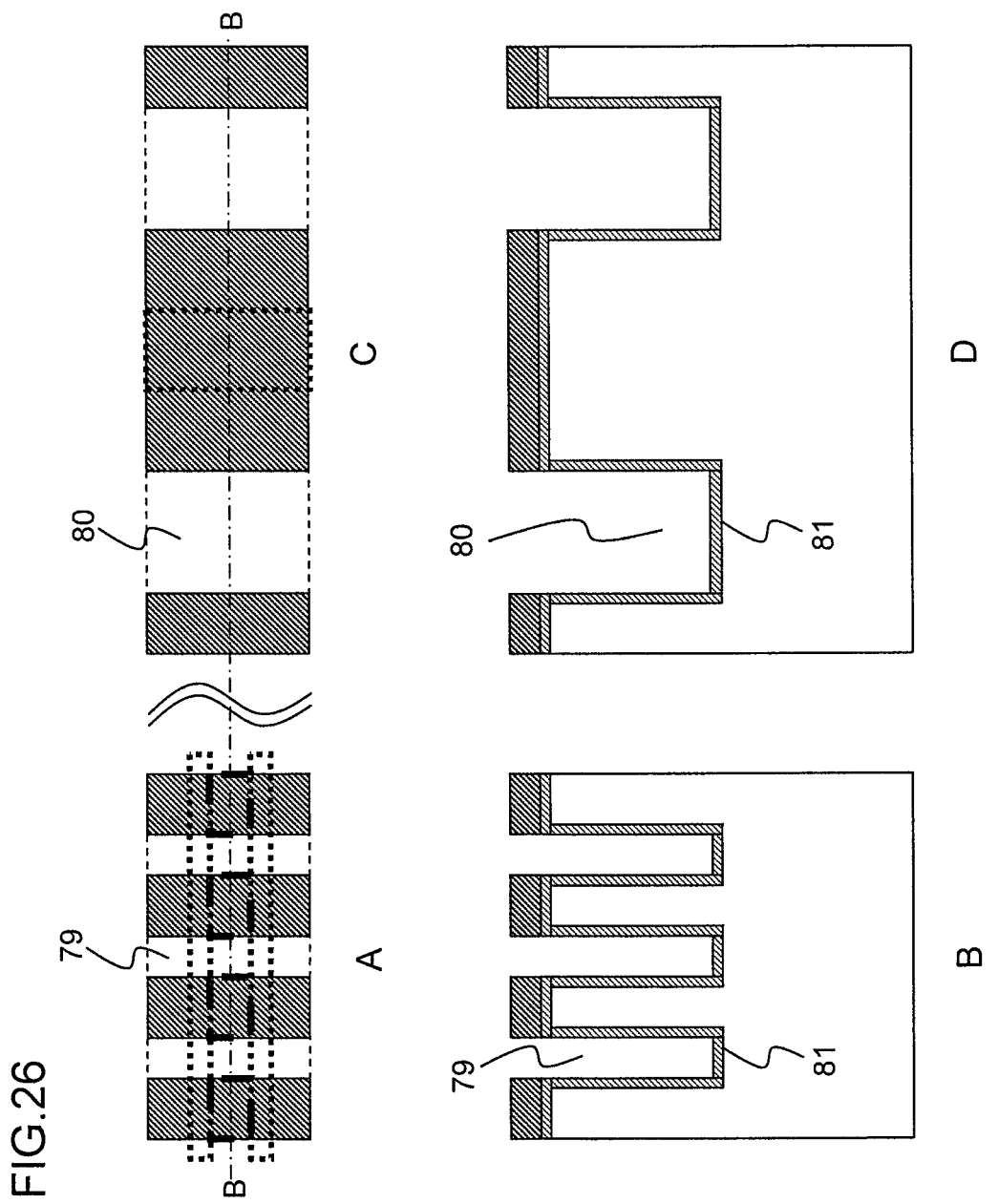

Next, as illustrated in FIG. 26, silicon oxide film 81 having a thickness of 5 nm was formed on the inner surfaces of trenches 79 for buried bit lines and well power-feeding trenches 80 by thermal oxidation.

Figure 27:
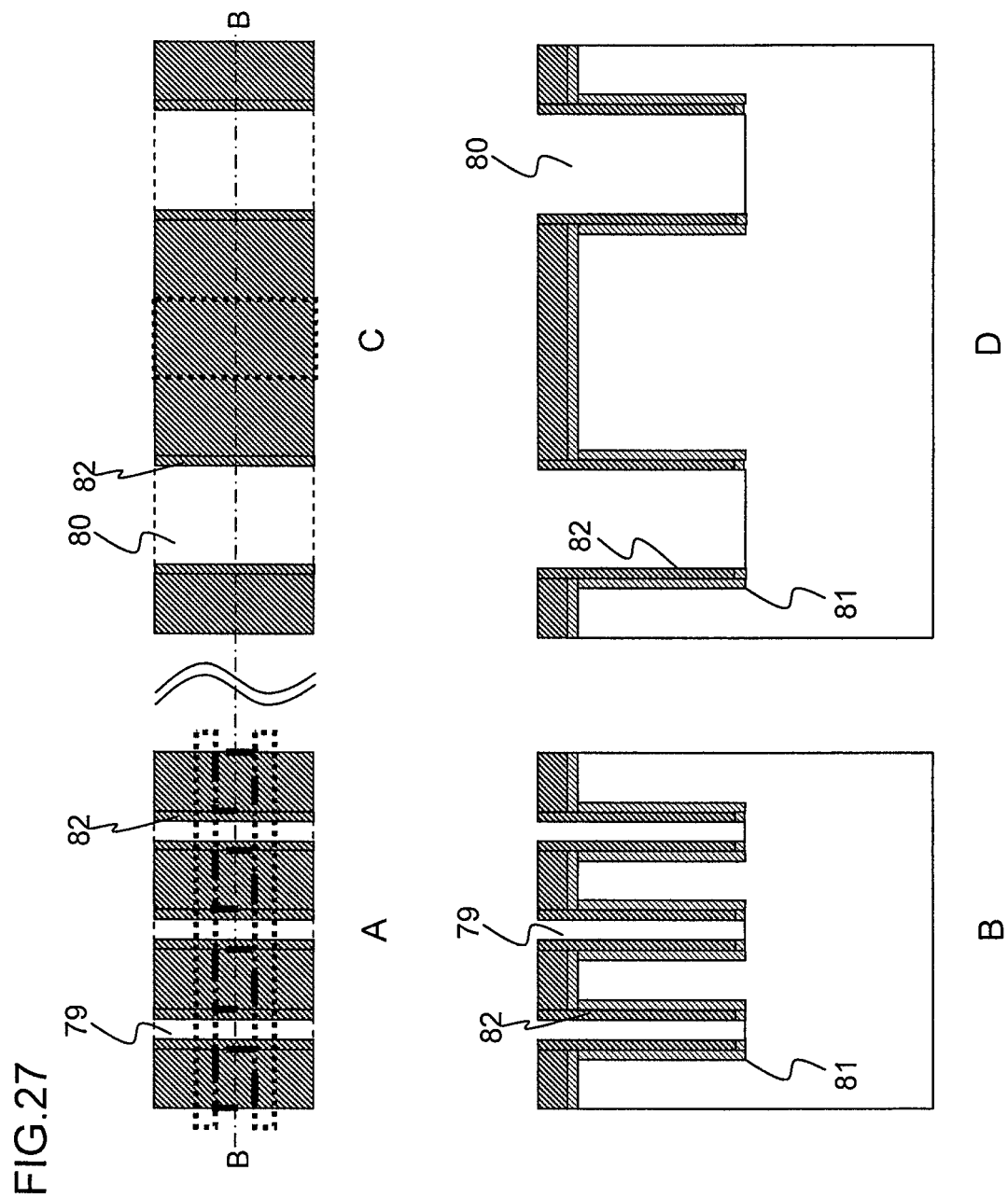

Next, as illustrated in FIG. 27, silicon nitride film (first insulating film) 82 having a thickness of 10 nm was formed by a CVD method. After this, silicon nitride film 82 was etched back to form sidewalls of silicon nitride film 82 on inner side surfaces of trenches 79 and 80. In the above-described etch-back, silicon oxide film 81 formed on the inner bottom surfaces of trenches 79 and 80 was also etched.

Figure 28:
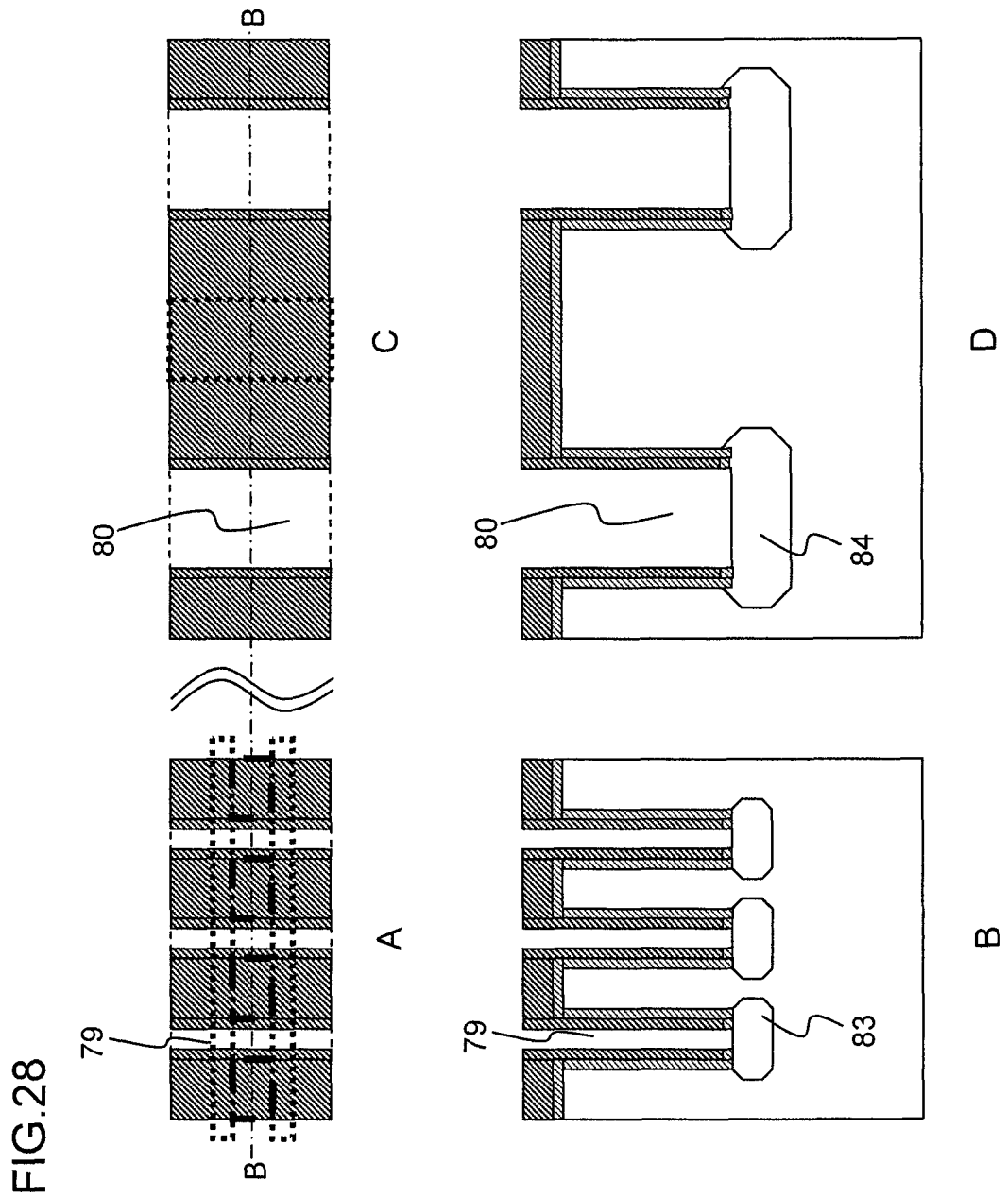

Next, as illustrated in FIG. 28, arsenic was doped into the bottoms of trenches 79 and 80 under the condition of 10 keV and $1\times10^{14}$ atoms/cm$^2$. Then, a heat treatment of 1000° C. was performed for 60 seconds to form n-type buried bit line 83 and n-type well power-feeding diffusion layers 84 on the bottoms of trenches 79 and 80, respectively. Since width of well power-feeding trenches 80 was large, the efficiency of ion implantation was superior. Accordingly, well power-feeding diffusion layers 84 were higher in concentration and wider in the spread of diffusion, in comparison to buried bit lines 83.

Figure 29:
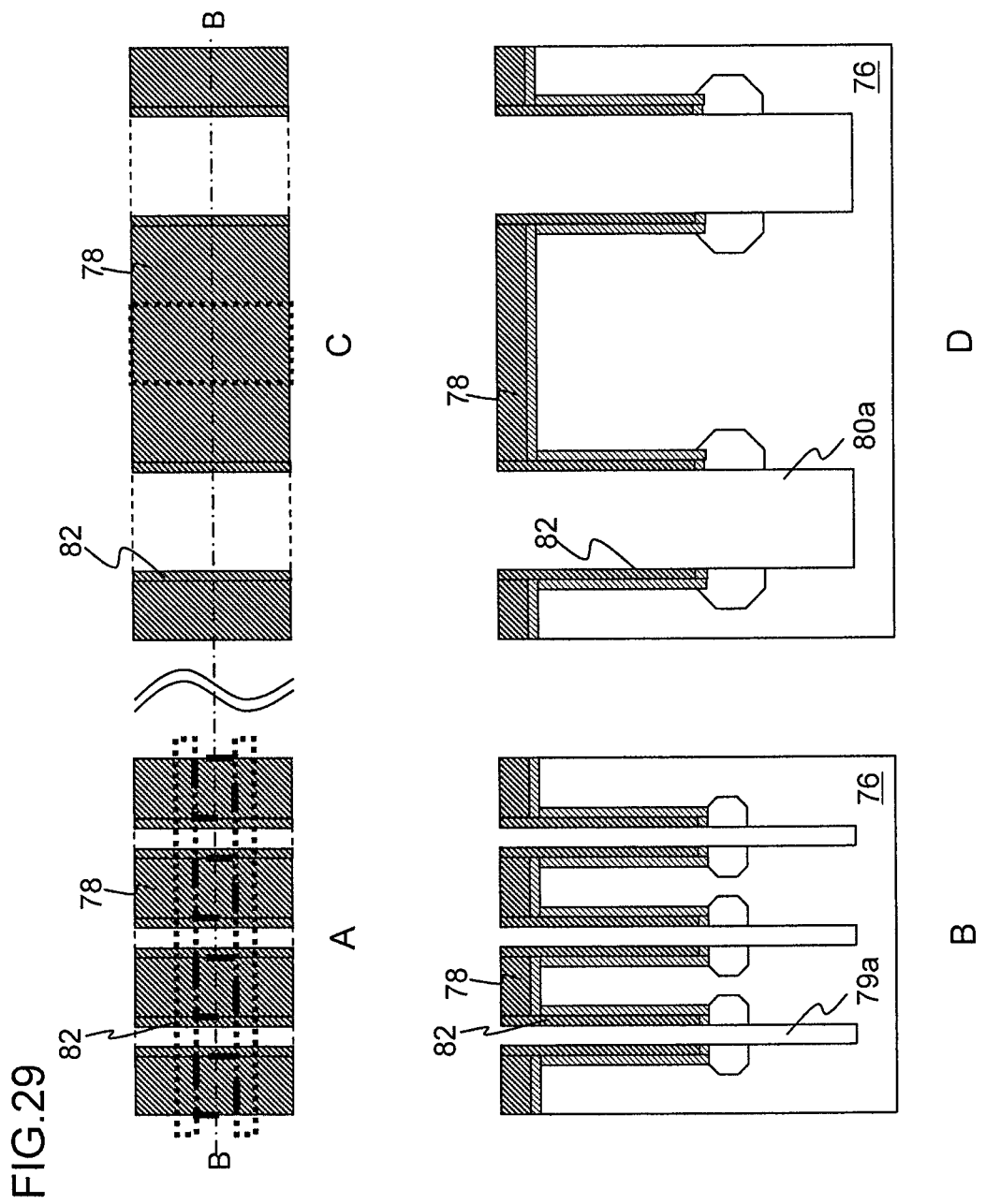

Next, as illustrated in FIG. 29, second trenches (third openings) 79a for buried bit lines and second well power-feeding trench (which serves as trench portions which are one example of trench isolations in the present exemplary embodiment) 80a were formed within silicon substrate 76 by dry etching using silicon nitride films 78 and 82 as processing masks. Here, the width and depth of second trenches 79a for buried bit lines were set to 25 nm and 100 nm, respectively. In addition, the width and depth of second well power-feeding trenches 80a were set to 95 nm and 100 nm, respectively.

Figure 30:
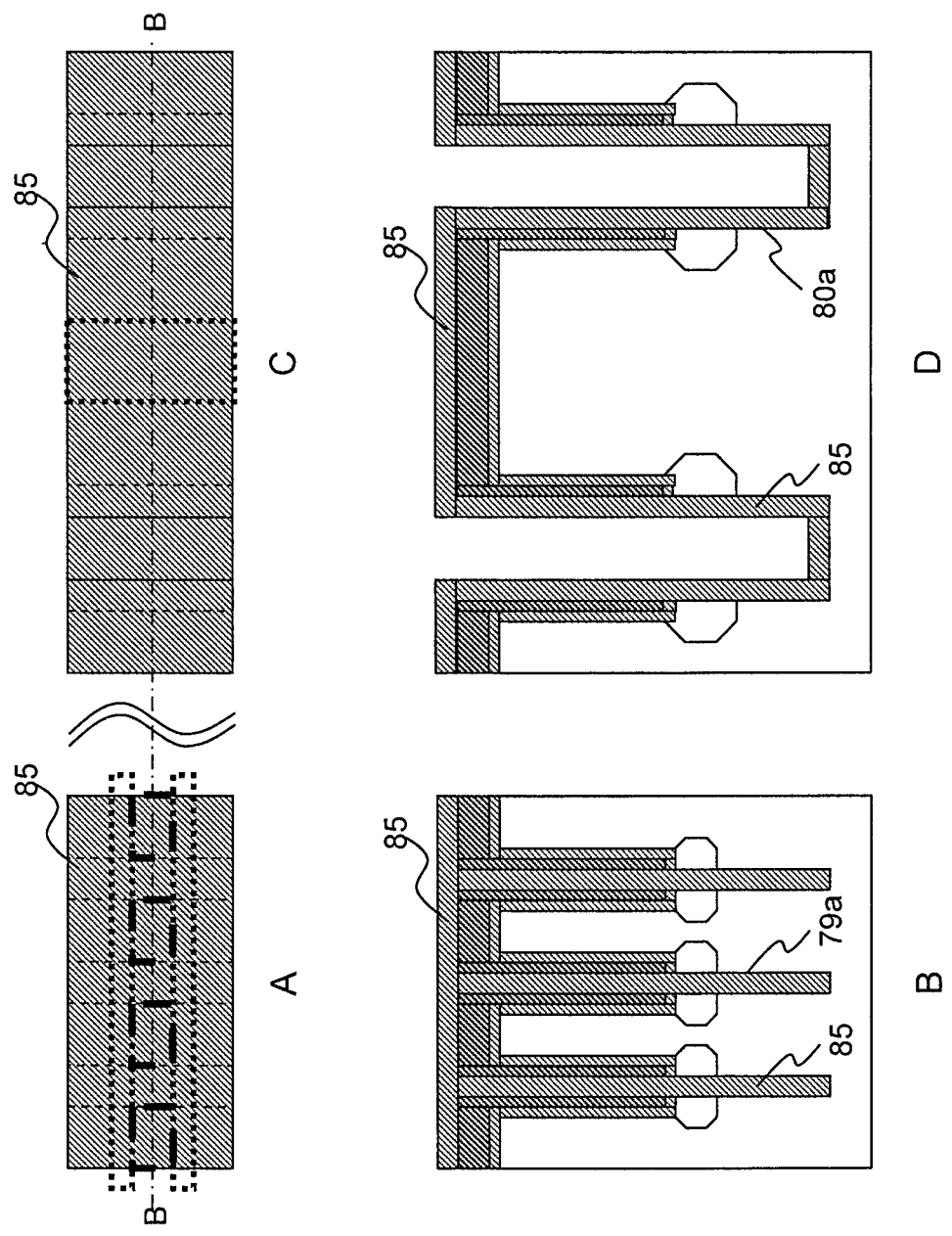

Next, as illustrated in FIG. 30, silicon oxide film (second insulating film) having a thickness of 5 nm was formed on exposed silicon portions of second trenches 79a for buried bit lines and second well power-feeding trenches 80a by thermal oxidation. After this, silicon oxide film (second insulating film) having a thickness of 20 nm was buried in the trenches 79a and 80a by a CVD method (in FIG. 30, the two types of silicon oxide films are shown as the same layer 85). At this time, there was obtained a structure in which trenches 79a for buried bit lines were completely filled with silicon oxide film 85, and well power-feeding trenches 80a were covered with silicon oxide film 85.

Figure 31:
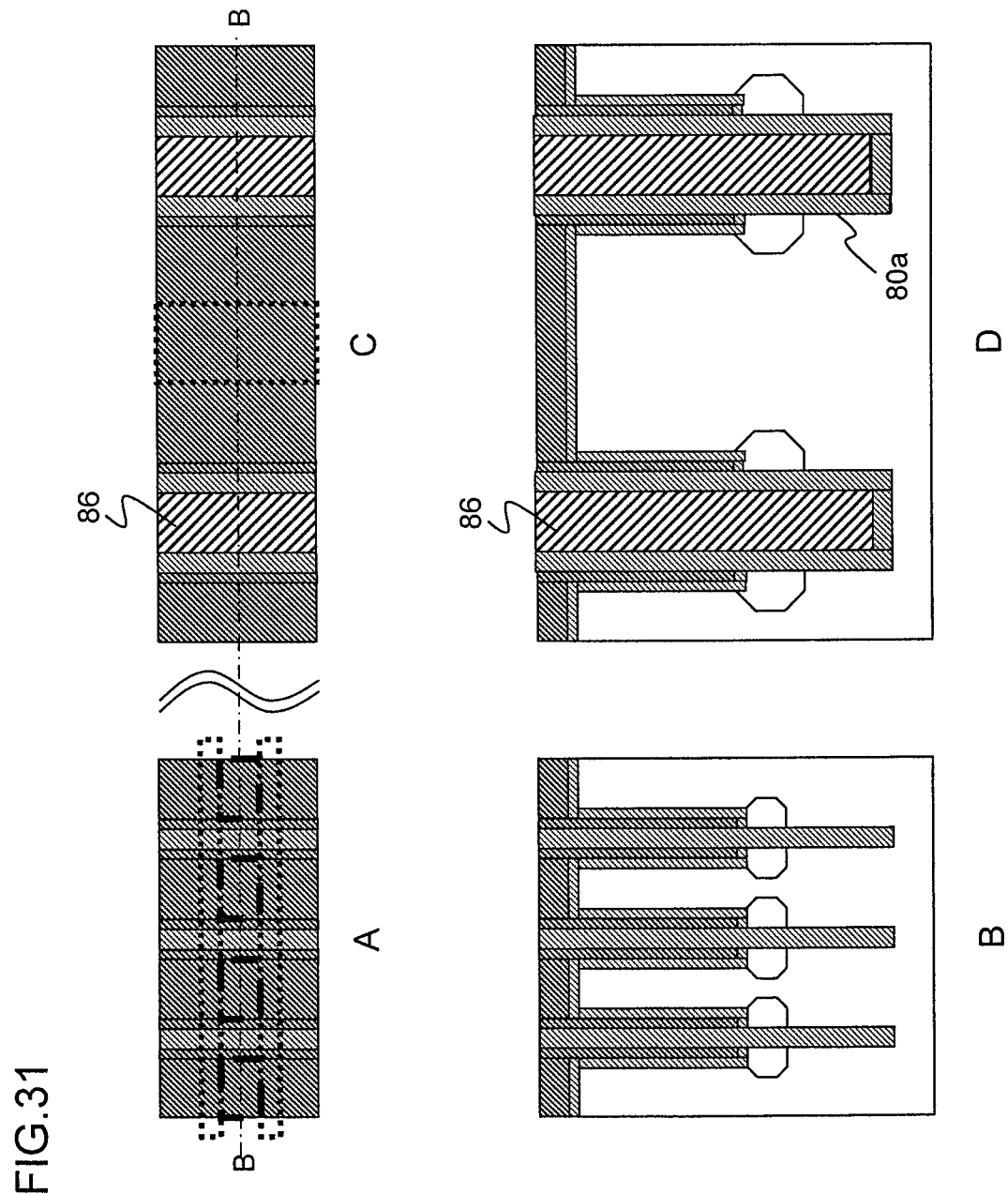

Next, as illustrated in FIG. 31, polycrystalline silicon film 86 having a thickness of 30 nm was deposited by a CVD method. After this, CMP was performed to completely fill well power-feeding trenches 80a with polycrystalline silicon 86.

Figure 32:
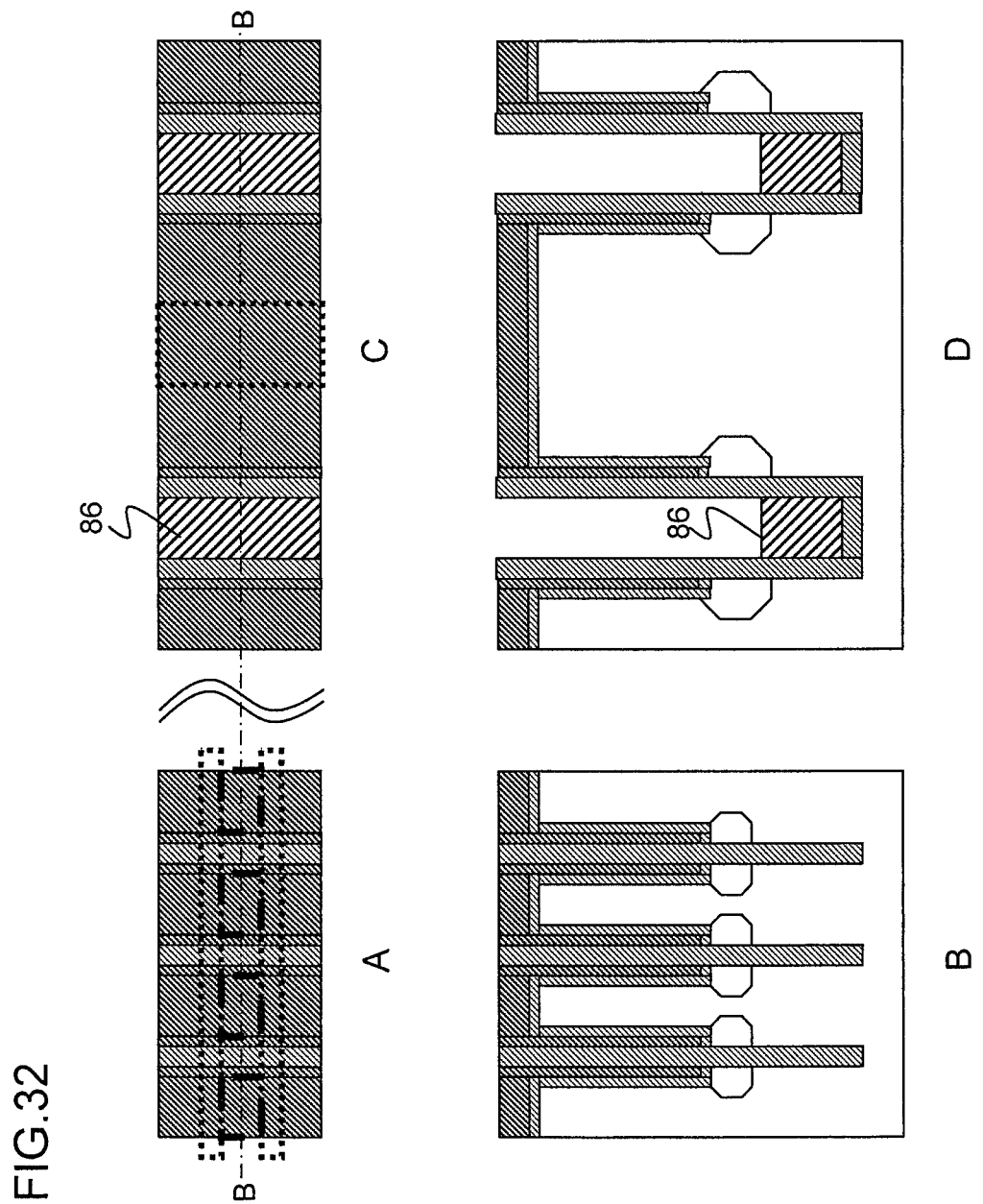

Next, as illustrated in FIG. 32, polycrystalline silicon film 86 was etched back by 180 nm in thickness.

Figure 33:
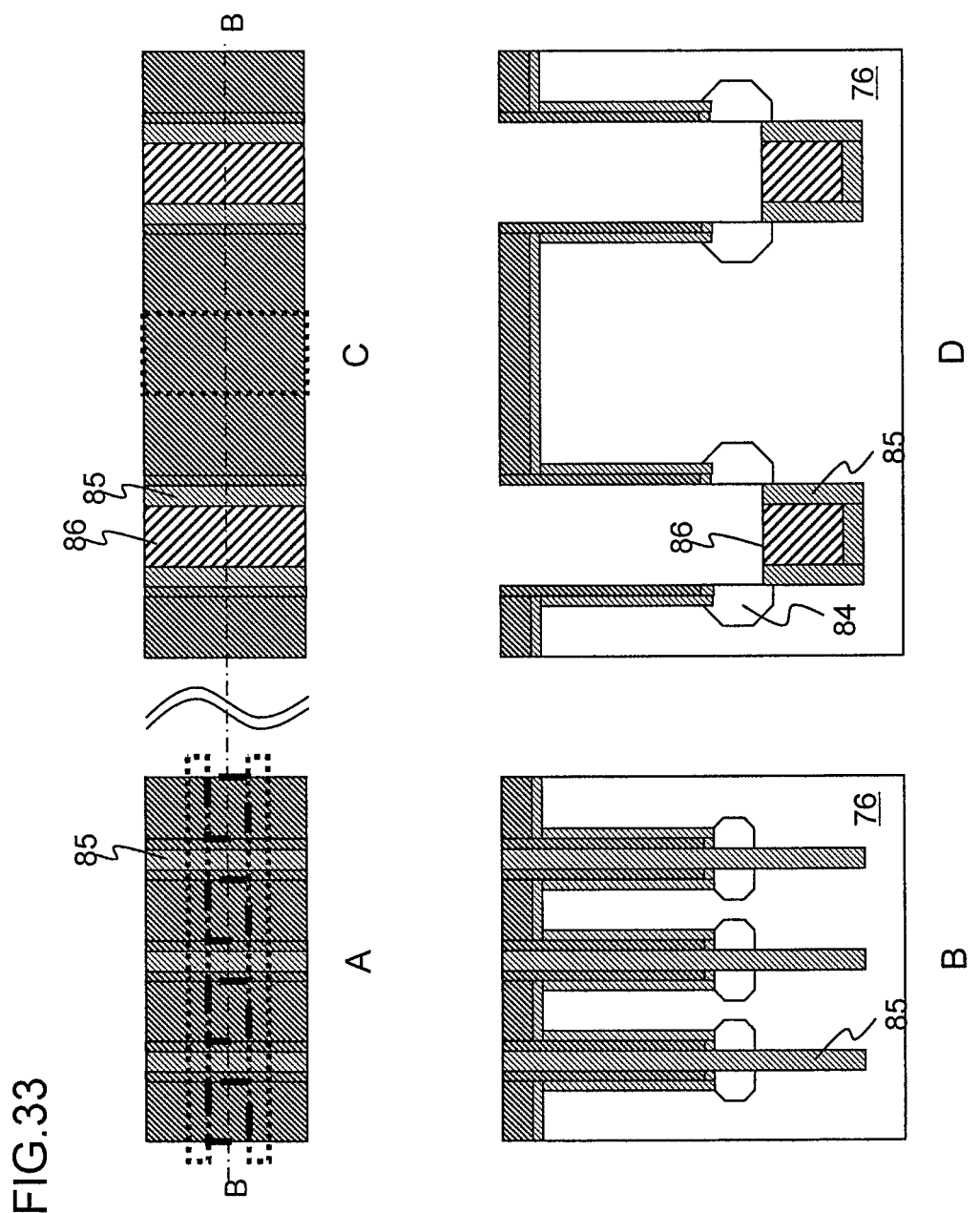

Next, as illustrated in FIG. 33, silicon oxide film 85 was etched to expose silicon substrate 76 in which well power-feeding diffusion layers 84 were formed. Subsequently, phosphorous was doped into the exposed portion of silicon substrate 76 and polycrystalline silicon film 86 by a usual plasma doping method, thereby transforming polycrystalline silicon film 86 into a part of a conductive wiring and forming n-type diffusion layers 84 on silicon substrate 76.

Figure 34:
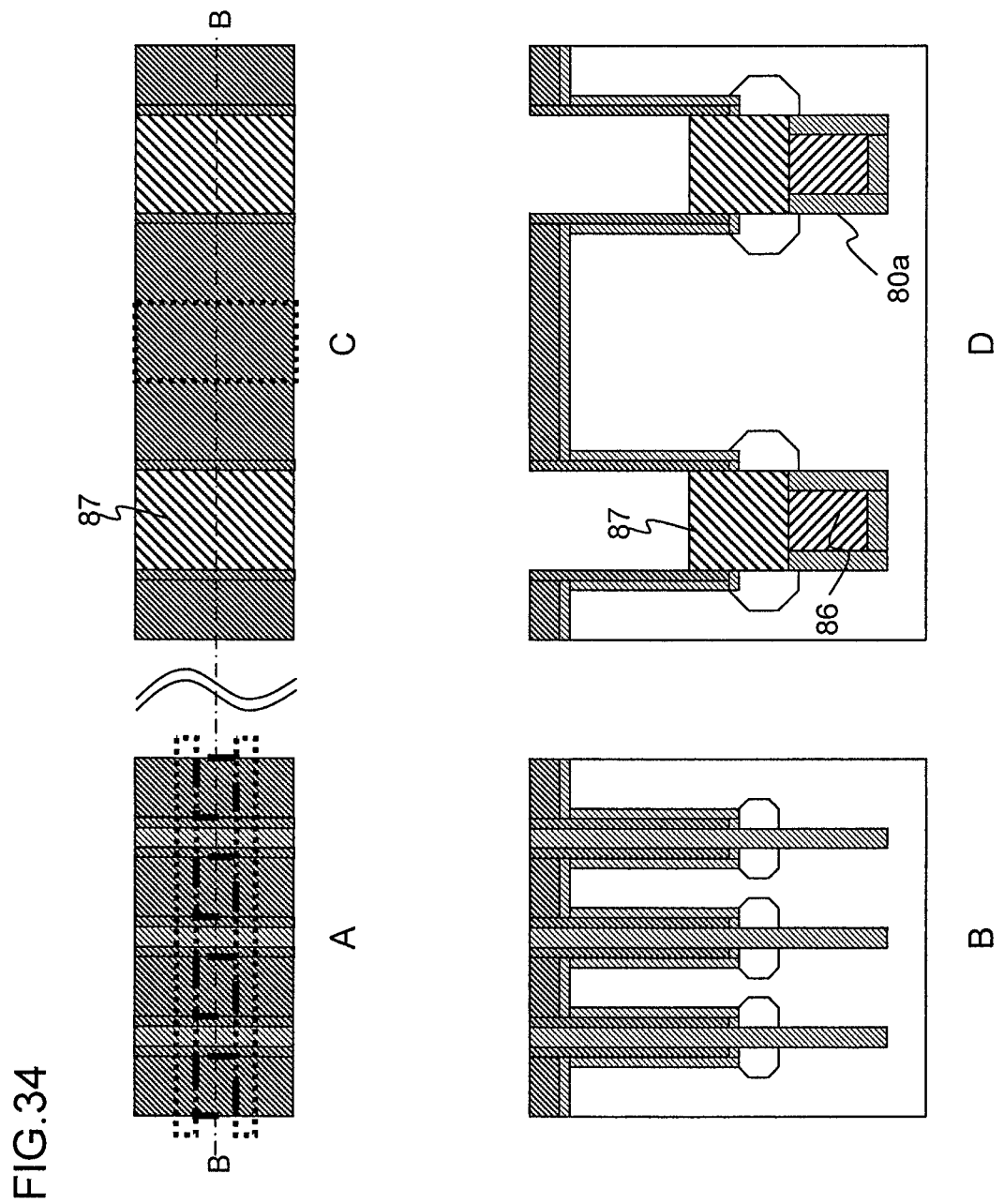

Next, as illustrated in FIG. 34, polycrystalline silicon film 87 having a thickness of 50 nm was deposited by a CVD method, and phosphorous was doped into polycrystalline silicon film 87 under the condition of 10 keV and $2\times10^{15}$ atoms/cm$^2$. After this, heat treatment of 1000° C. was performed for 60 seconds to diffuse phosphorous into polycrystalline silicon films 86 and 87 buried in well power-feeding trenches 80a. After that, CMP was performed in the same way as described above, and then polycrystalline silicon film 87 was etched back by 120 nm in thickness, thereby completing the conductive wiring.

Figure 35:
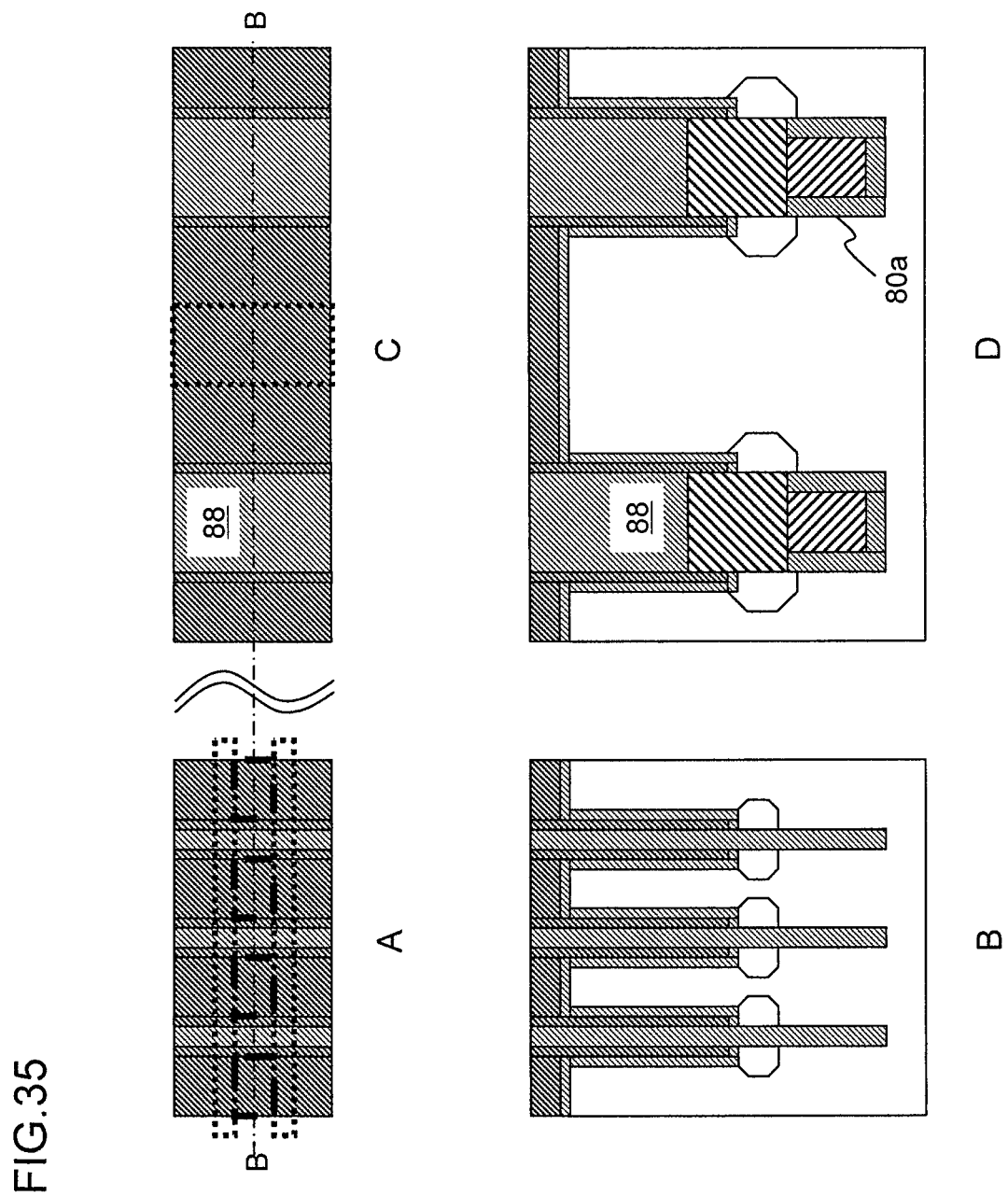

Next, as illustrated in FIG. 35, silicon oxide film 88 having a thickness of 30 nm was deposited by a CVD method. After this, CMP was performed to bury silicon oxide film 88 in the upper portions of well power-feeding trenches 80a, thereby forming insulating film 88.

Figure 36:
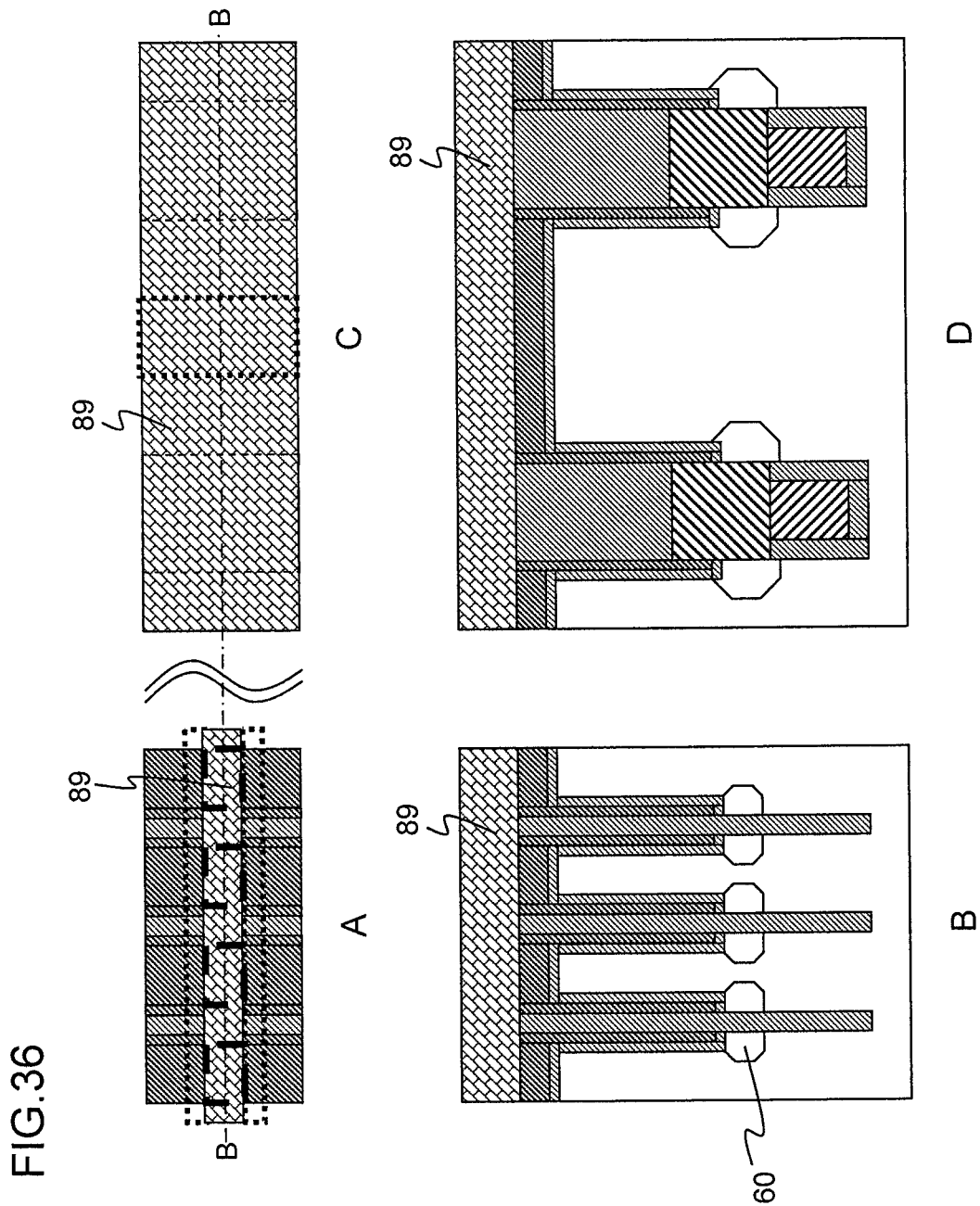

Next, as illustrated in FIG. 36, in order to form pillars in the cell transistor portion, line-shaped resist mask 89 was formed in a direction perpendicular to the extending direction of a buried bit line 60, as illustrated in Drawing A. In addition, mask 89 was formed so that the entire range of a peripheral portion was covered with the mask 89.

Although drawings for subsequent manufacturing processes up to a step of forming gate electrode 54 (word line 54) of a cell transistor (structure illustrated in FIG. 24) will not be shown here, subsequent structure is formed according to the below-described process sequence. First, silicon oxide film 85 of cell portion was etched and an upper surface thereof was recessed to a position deeper by 140 nm from the surface of silicon substrate 76. Next, silicon nitride films 78 and 82 of cell transistor portion were etched and upper surfaces thereof were recessed to a position deeper by 140 nm from the surface of silicon substrate 76. After that, mask 89 was removed, and then silicon oxide film 77 and a part of silicon substrate 76 were etched and upper surfaces thereof were recessed to a position deeper by 140 nm from the surface of silicon substrate 76.

After that, a surface of the exposed portion of silicon substrate 76 was thermally oxidized to form silicon oxide film 62 (gate insulating film 62) having a thickness of 6 nm. After that, gate electrode film 54 including a titanium nitride film having a thickness of 5 nm and a tungsten film having a thickness of 20 nm was deposited. Then, gate electrode film 54 was etched and an upper surface thereof was recessed to a position deeper by 30 nm from the surface of silicon substrate 76, thereby forming gate electrodes 54 (word lines 54).

Figure 37:
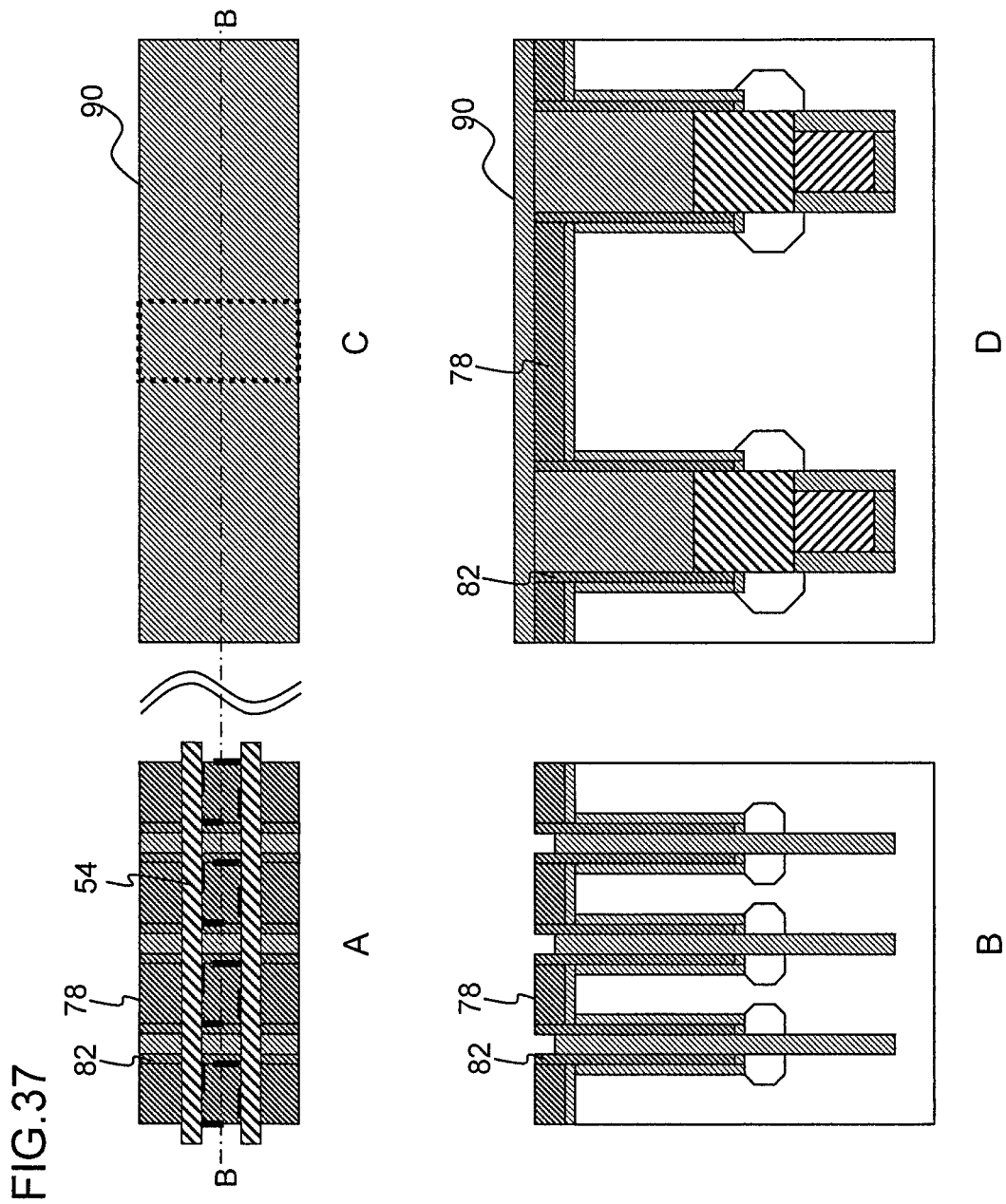

Next, as illustrated in FIG. 37, silicon oxide film 90 having a thickness of 50 nm was deposited by a CVD method to bury silicon oxide film 90 between gate electrodes 54 of the cell transistor portion. After this, silicon oxide film 90 of the cell transistor portion was dry-etched by 70 nm in thickness to expose silicon nitride films 78 and 82.

Figure 38:
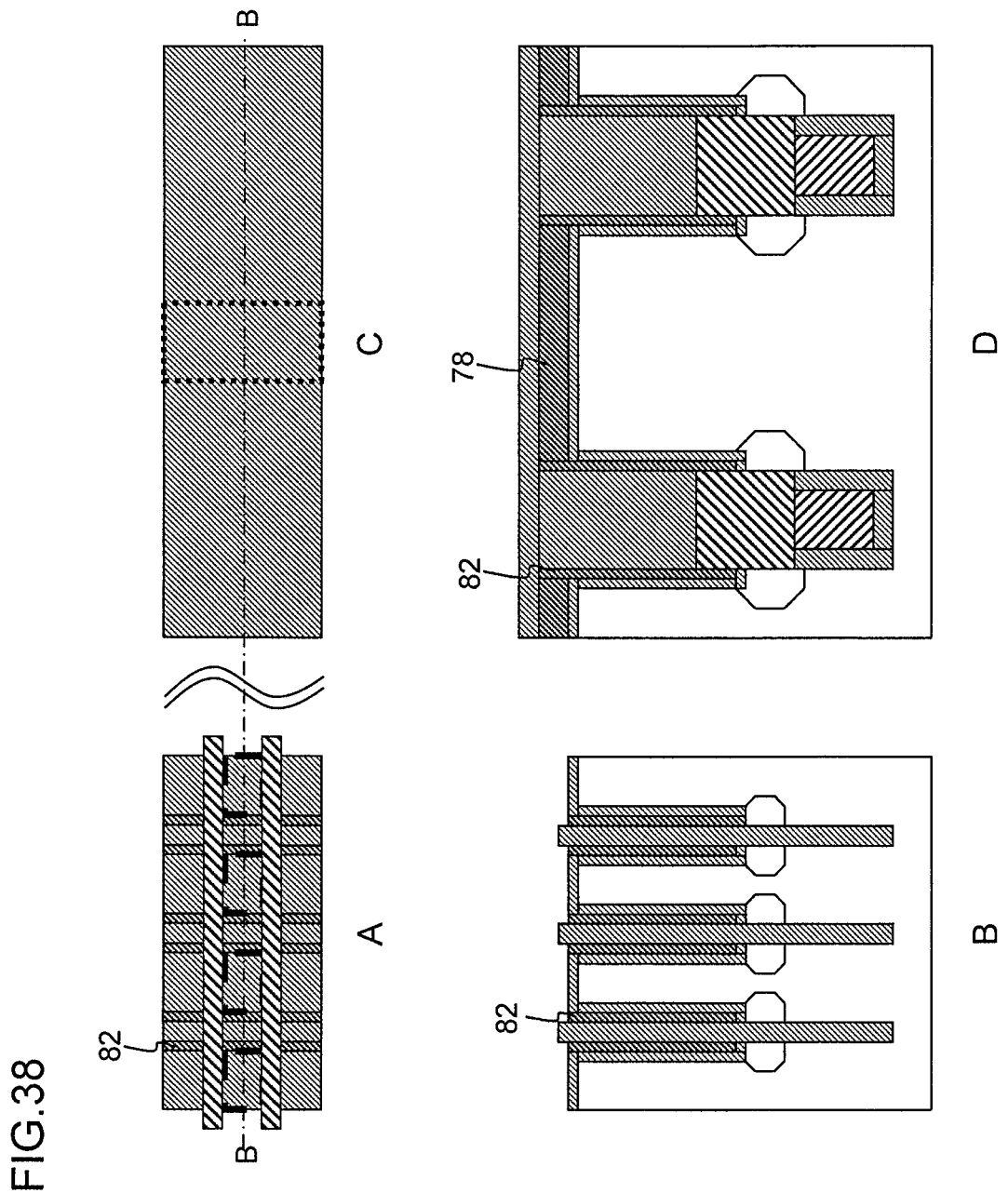

Next, as illustrated in FIG. 38, silicon nitride films 78 and 82 were dry-etched so that silicon nitride film 78 of cell transistor portion was completely removed.

Figure 39:
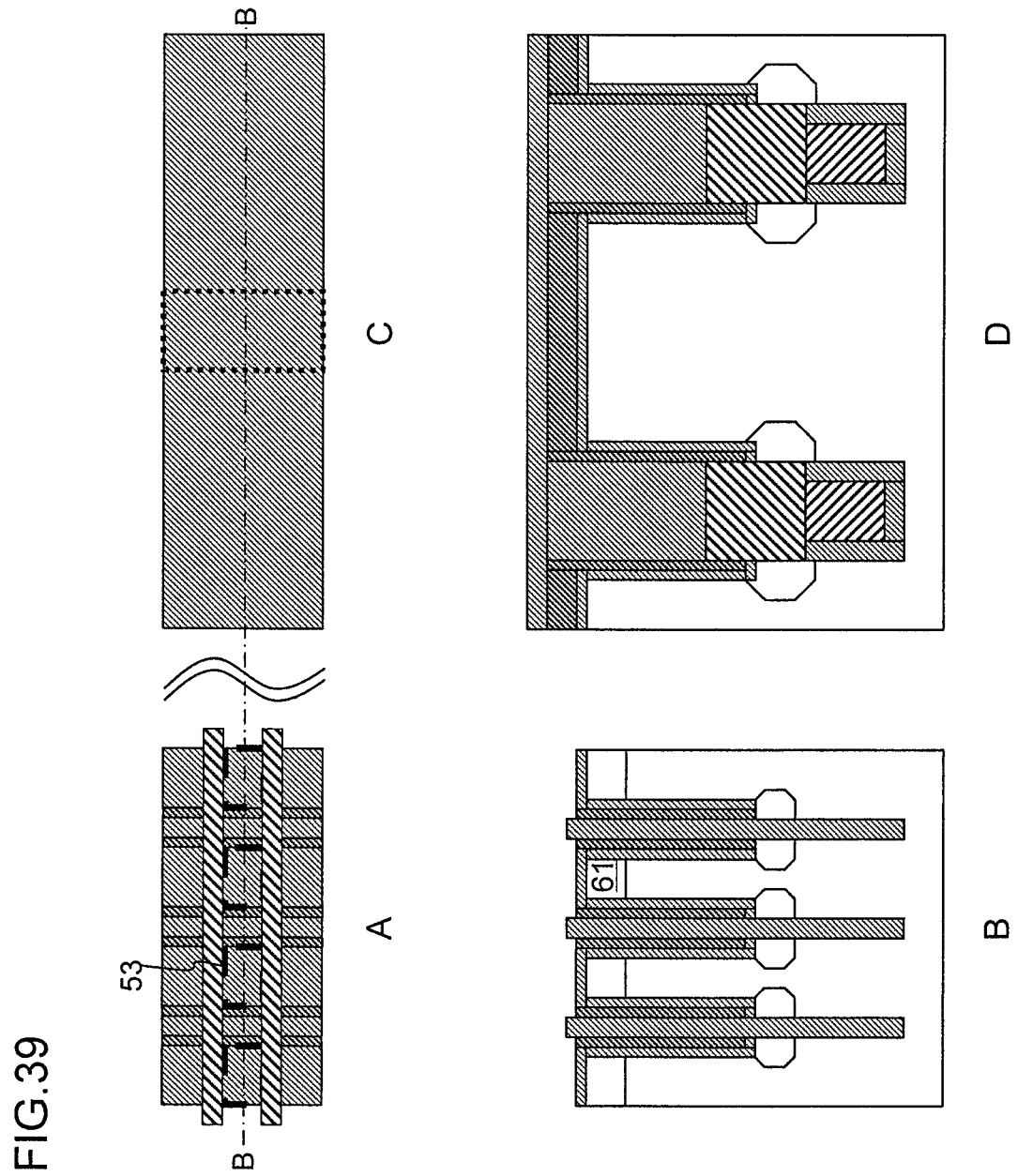

Next, as illustrated in FIG. 39, arsenic was doped into the pillars 53 under the condition of 10 keV and $1\times10^{14}$ atoms/cm$^2$, and heat treatment of 900° C. was performed for 10 seconds to form n-type diffusion layers 61 in the upper portions of pillars 53.

Figure 40:
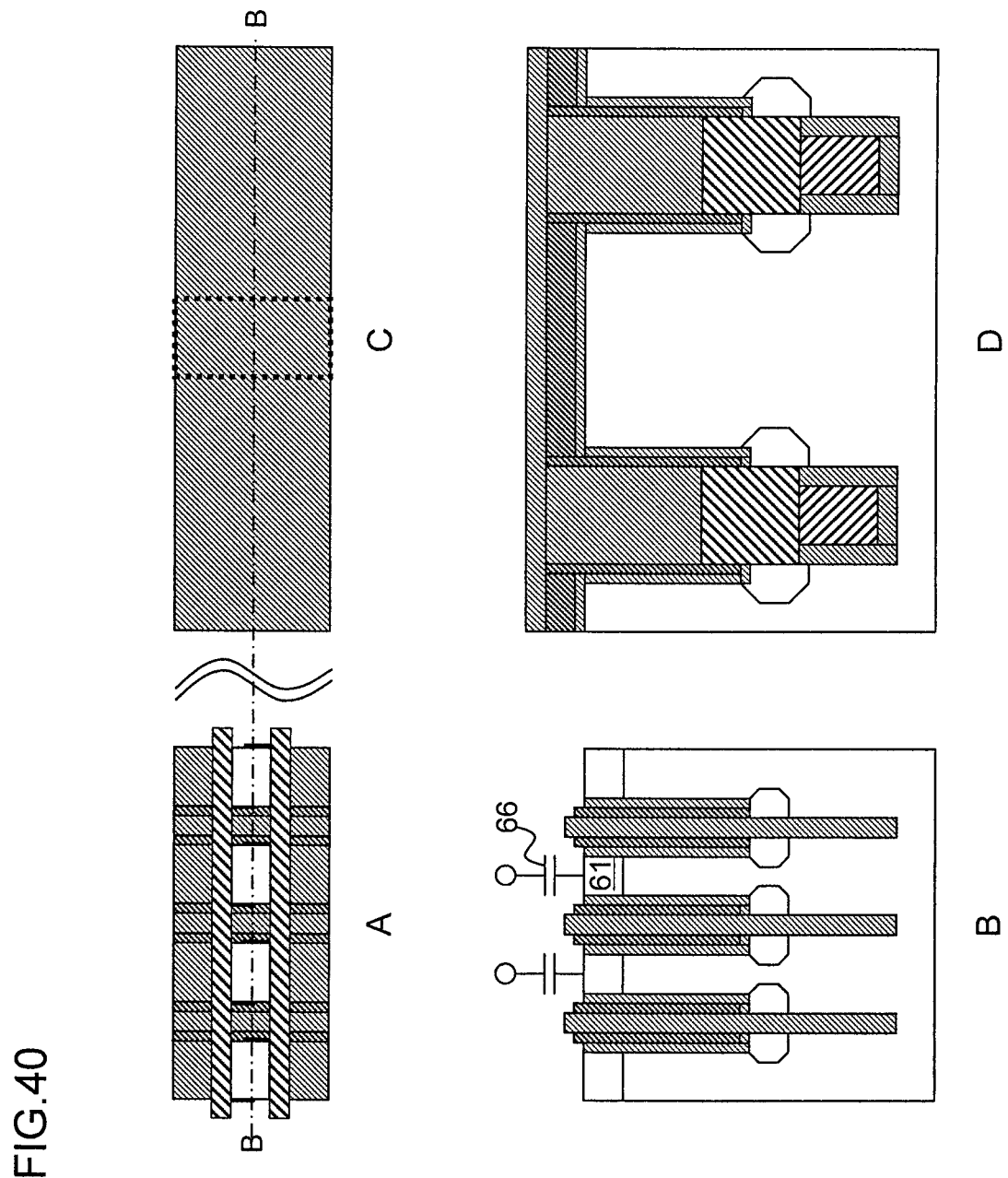

Next, as illustrated in FIG. 40, capacitors 66 were formed above n-type diffusion layers 61 by a usual capacitor manufacturing method. The subject matter of the present invention has no concern with a method of manufacturing capacitors, and therefore, the method will not be discussed here. Also in subsequent steps, the cell transistor portion is protected by an insulating film or the like.

Figure 41:
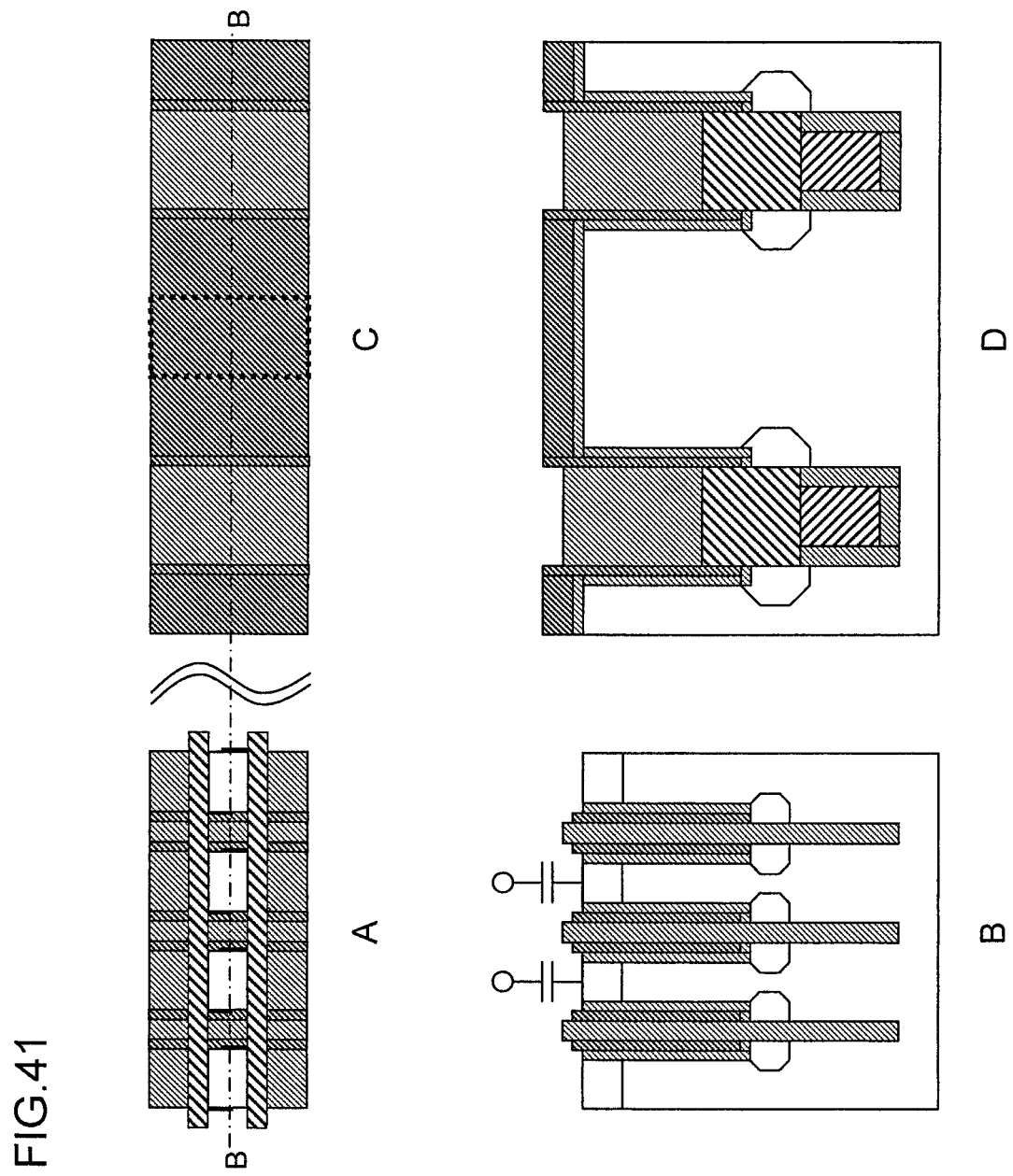

Next, as illustrated in FIG. 41, silicon oxide film 90 of the peripheral transistor portion was removed.

Figure 42:
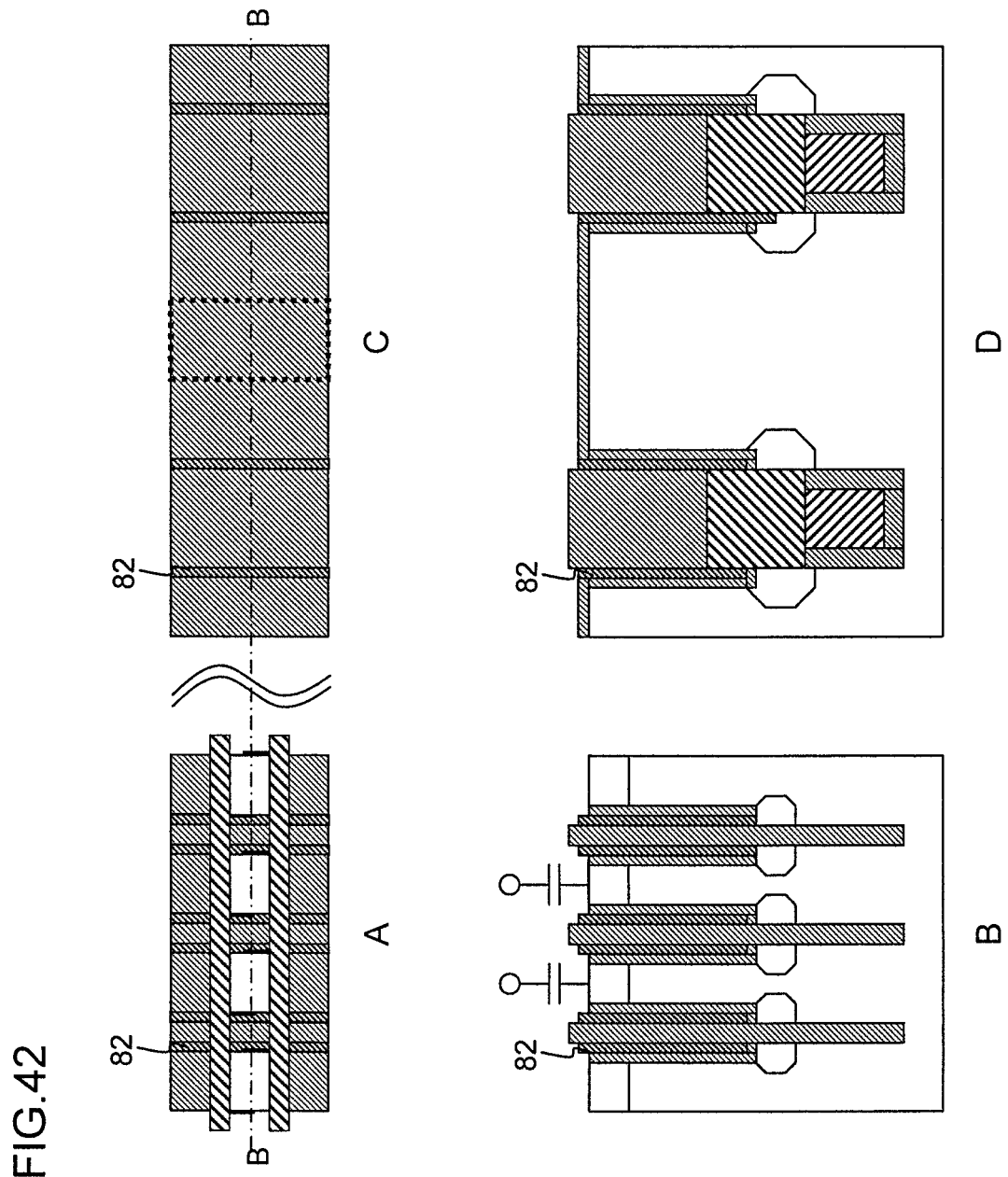

After that, as illustrated in FIG. 42, silicon nitride film 78 was removed. The upper portion of silicon nitride film 82 was also removed at the time of removing silicon nitride film 78.

Figure 43:
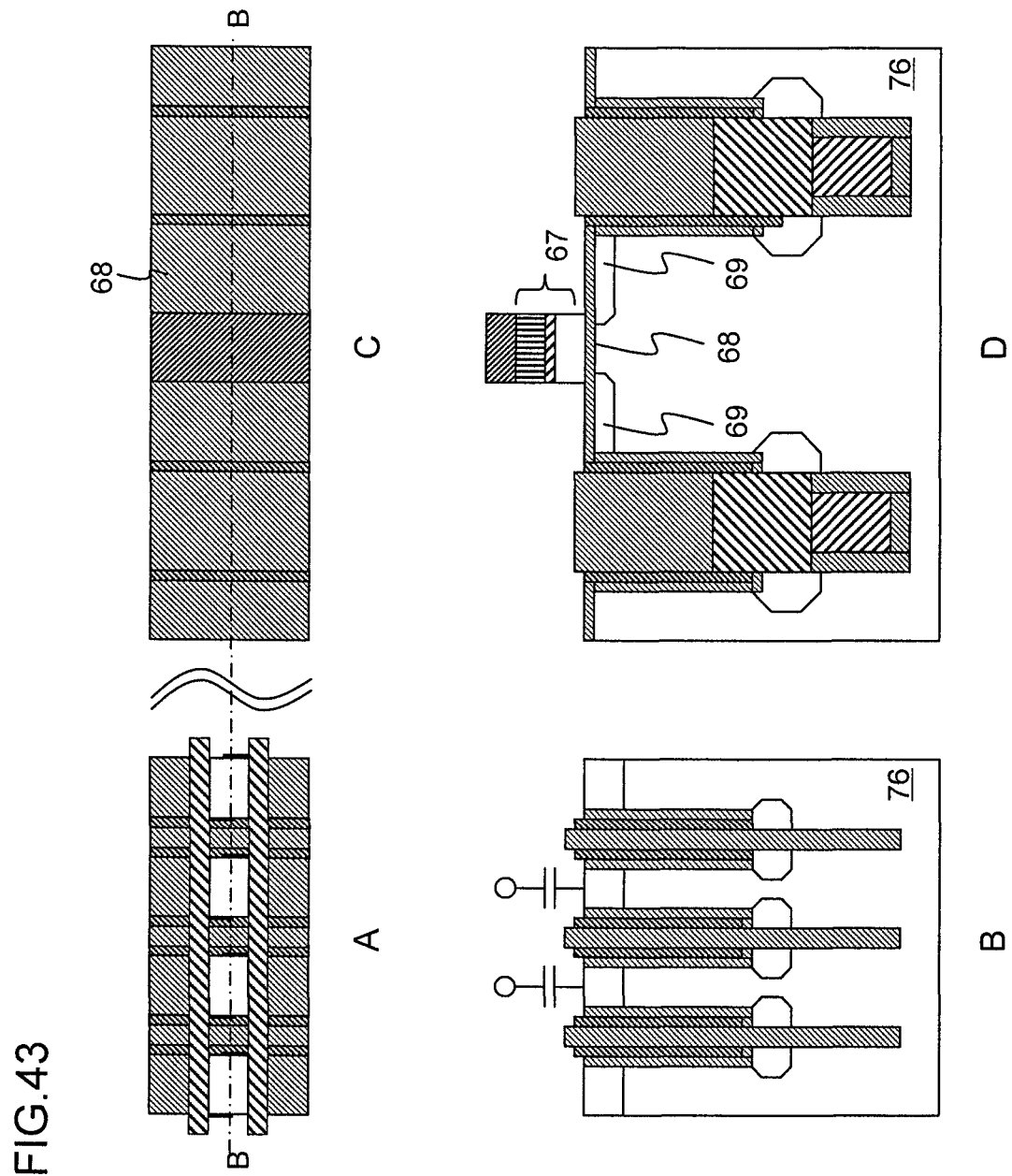

Next, as illustrated in FIG. 43, silicon oxide film 77 was removed, and then gate oxide film 68 having a thickness of 3 nm was formed by thermal oxidation. Next, three-layered gate electrode 67 was formed by a CVD method. The gate electrode 67 comprises a boron-doped p-type polycrystalline silicon film having a thickness of 50 nm, a tungsten nitride film having a thickness of 5 nm, and a tungsten film having a thickness of 50 nm. Finally, boron was doped into silicon substrate 76 under the condition of 5 keV and $1\times10^{15}$ atoms/cm$^2$, and heat treatment of 950° C. was performed for 10 second, thereby forming p-type diffusion layers 69.

After this, interlayer insulating film, contact hole, electrode and conductive wiring (all components are not shown in figures) were formed. Since these were formed by usual steps, they will not be discussed here.

Figure 44:
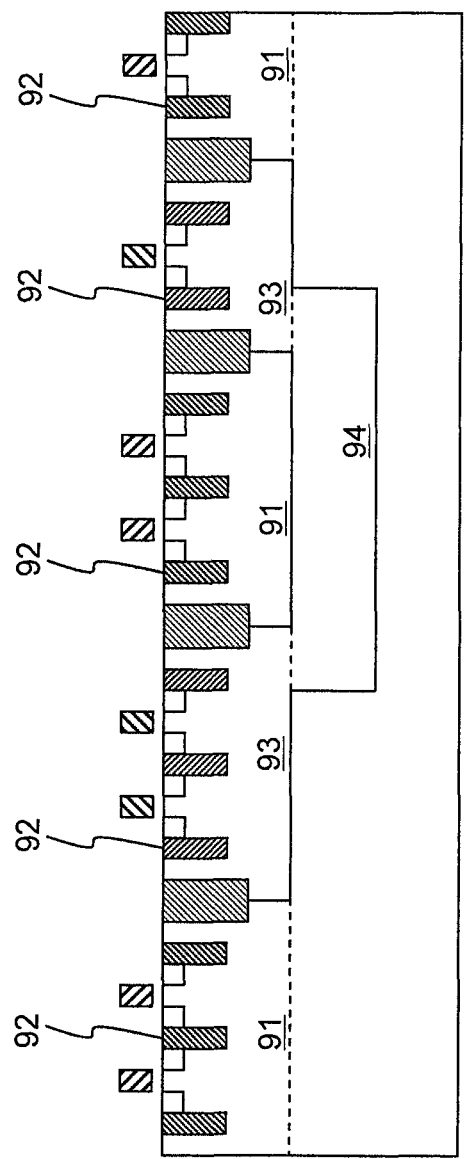
FIGS. 44 and 45 are cross-sectional views illustrating modified examples of the third exemplary embodiment of the present invention.
Figure 45:
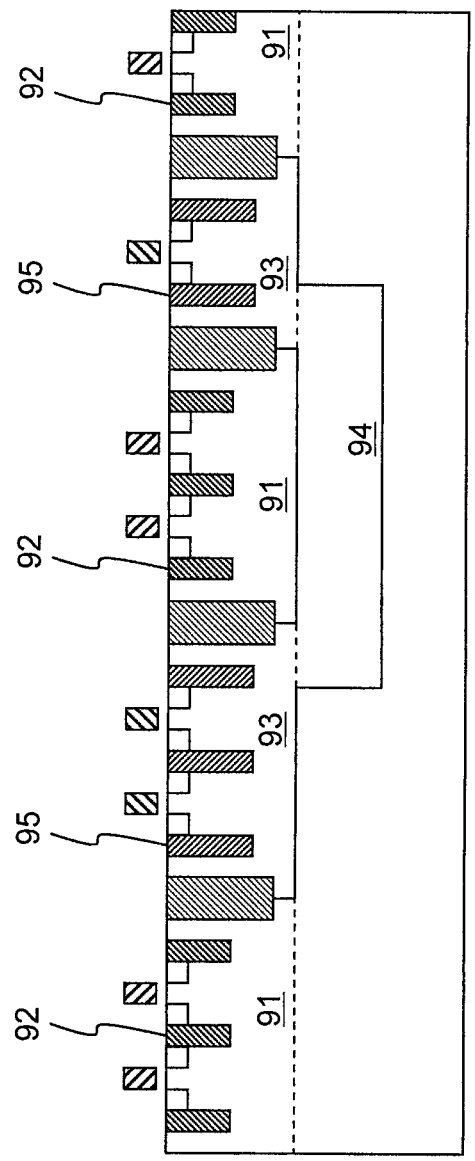

As described above, in the third exemplary embodiment, it is possible to simultaneously manufacture buried bit lines 52 and trench-buried well power-feeding portions 55. Consequently, steps can be simplified. In the present exemplary embodiment, peripheral transistor portion 51 is specified as an n-type well. However, as illustrated in FIG. 44, the present exemplary embodiment can also be applied to p-type well layers 91. In FIG. 44, p-type well regions 91 and n-type well regions 93 are provided, and n-type deep well layer 94 is further provided underneath p-type well region 91, so as to be the same in potential as n-type well regions 93. As illustrated in FIG. 44, mask for an implantation may be contrived at the time of, for example, doping for the formation of well power-feeding diffusion layers 92 or doping into polycrystalline silicon to be buried in well power-feeding portions 92, so that an n-type dopant is doped into n-type well regions 93 and a p-type dopant is doped into p-type well regions 91. In addition, as illustrated in FIG. 45, well power-feeding trenches 95 in n-type well layers 93 having the same potential as n-type deep well layers 94 may be made deeper than well power-feeding trenches 92 formed in p-type well layers 91 on a case-by-case basis.

It is apparent that the present invention is not limited to the above embodiments, but may be modified and changed without departing from the scope and spirit of the invention.

What is claimed is:

1. A method of manufacturing a semiconductor device, comprising:
   forming a well region in a surface of a semiconductor substrate;
   forming a trench in the well region so that a bottom of the trench is positioned within the well region; and
   forming a conductive wiring in the trench so as to be electrically connected to the well region, and then forming an insulating film which buries the conductive wiring in the bottom of the trench, to form a trench isolation,
   wherein the forming the trench comprises:
   forming a first opening within the semiconductor substrate;
   forming a first insulating film on an inner side surface of the first opening; and
   extending the first opening in a thickness direction of the semiconductor substrate by etching the semiconductor substrate using the first insulating film as a mask, to form a trench portion.

2. The method of manufacturing a semiconductor device according to claim 1,
   wherein the forming the conductive wiring and the insulating film comprises:
   forming a second insulating film on an inner surface of the trench portion not covered with the first insulating film;
   burying polycrystalline silicon in a bottom of the trench portion, so as to expose a part of the second insulating film;
   removing the exposed part of the second insulating film, to expose a part of the well region;
   doping an impurity having a same conductivity type as the well region into the exposed part of the well region and the polycrystalline silicon, to form a diffusion layer and a part of the conductive wiring, respectively;
   forming a further conductive wiring on the part of the conductive wiring in the trench portion; and
   forming an insulating film on the conductive wiring in the trench portion.

3. The method of manufacturing a semiconductor device according to claim 1,
   wherein the forming the conductive wiring and the insulating film comprises:
   forming a second insulating film on an inner surface of the trench portion not covered with the first insulating film;
   forming polycrystalline silicon, so as to fill the trench portion from the surface of the semiconductor substrate;
   providing a mask including an opening above a part of the polycrystalline silicon, on the semiconductor substrate;
   removing the part of the polycrystalline silicon buried in the trench portion by anisotropic etching the polycrystalline silicon using the mask, to expose the second insulating film on one inner side surface of two inner side surfaces of the trench portion opposite to each other;
   removing the exposed second insulating film, to expose a part of the well region;
   doping an impurity having a same conductivity type as the well region into the exposed part of the well region and the polycrystalline silicon, to form a diffusion layer and a part of the conductive wiring, respectively;
   forming a further conductive wiring on the part of the conductive wiring in the trench portion; and
   forming an insulating film on the conductive wiring in the trench portion.

4. The method of manufacturing a semiconductor device according to claim 1,
   wherein the forming the trench further comprises:
   doping an impurity into the well region underneath an inner bottom surface of the first opening by using the first insulating film as a mask, to form a diffusion layer,
   wherein the forming the conductive wiring and the insulating film comprises:
   forming a second insulating film on an entire inner surface of the trench portion;
   forming a part of the conductive wiring in a bottom of the trench portion, so as to be positioned lower than the diffusion layer in the thickness direction of the semiconductor substrate;
   removing the exposed second insulating film, to expose the diffusion layer;
   forming a further conductive wiring on the part of the conductive wiring in the trench portion; and
   forming an insulating film on the conductive wiring in the trench portion.

5. The method of manufacturing a semiconductor device according to claim 4, further comprising forming a MOS transistor in the well region.

6. The method of manufacturing a semiconductor device according to claim 4,
   wherein in the forming the first opening within the semiconductor substrate, a second opening is formed in the well region other than a region including the first opening in the semiconductor substrate, simultaneously with formation of the first opening,
   in the forming the first insulating film on the inner side surface of the first opening, the first insulating film is formed on an inner side surface of the second opening, simultaneously with formation of the first insulating film on the inner side surface of the first opening,
   in the doping the impurity, the impurity is doped into a region underneath a inner bottom surface of the second opening by using the first insulating film on the inner side surface of the second opening as a mask, to form a buried bit line, simultaneously with formation of the diffusion layer, in the extending the first opening, the second opening is extended in the thickness direction of the semiconductor substrate by etching the semiconductor substrate using the first insulating film as the mask, to form a third opening, simultaneously with formation of the trench portion, and in the forming the second insulating film, the third opening is filled up with an insulating material, simultaneously with formation of the second insulating film on the inner surface of the trench portion.

7. The method of manufacturing a semiconductor device according to claim 6, further comprising:

forming a vertical MOS transistor so that one of a source and a drain of the vertical MOS transistor is electrically connected to the buried bit line; and forming a capacitor so that the other one of the source and the drain is electrically connected to the capacitor.

8. The method of manufacturing a semiconductor device according to claim 7, wherein a shortest distance between the source and drain of the vertical MOS transistor and the conductive wiring in the thickness direction of the semiconductor substrate is 20 μm or longer.

9. A method of manufacturing a semiconductor device, comprising:

forming a well region below an uppermost surface of a semiconductor substrate;

forming a trench in the well region so that a bottom of the trench is positioned within the well region, said trench having two opposite vertical walls defining an overwidth of said trench; and forming a conductive wiring in the trench so as to be electrically connected to the well region, and then forming an insulating film which buries the conductive wiring in the bottom of the trench, to form a trench isolation, wherein, the conductive wiring is formed in the trench with an uppermost surface of said conductive wiring located below the uppermost surface of said semiconductor substrate, and the insulating film which buries the conductive wiring in the bottom of the trench isolation has a lowermost surface contacting the uppermost surface of said conductive wiring to form an interface between said insulating film and said uppermost surface of said conductive wiring, and at said interface, said insulating film contacting each of said two opposite vertical walls defining the overall width of said trench.

10. A semiconductor device comprising:

a well region formed in a surface of a semiconductor substrate;

a trench isolation formed in the surface of the semiconductor substrate to define an active region in the well region, a bottom of the trench isolation being positioned within the well region, said trench isolation having two opposite vertical walls defining an overall width of said trench isolation;

a conductive wiring formed in the trench isolation at the bottom thereof with an uppermost surface of said conductive wiring located below an uppermost surface of said semiconductor substrate, the conductive wiring being electrically connected to the well region;

an insulating film which buries the conductive wiring in the bottom of the trench isolation, a lowermost surface of the insulating film contacting the uppermost surface of said conductive wiring to form an interface between said insulating film and said uppermost surface of said conductive wiring, and at said interface, said insulating film contacting each of said two opposite vertical walls defining the overall width of said trench isolation; and a semiconductor element disposed in the active region.

11. The semiconductor device according to claim 10, further comprising:

a cell transistor portion defined on the semiconductor substrate; and a peripheral transistor portion including the active region, wherein the cell transistor portion comprises:

a vertical MOS transistor;

a buried bit line buried in the semiconductor substrate and electrically connected to one of a source and a drain of the vertical MOS transistor; and a capacitor electrically connected to the other one of the source and the drain, wherein the vertical MOS transistor, the buried bit line and the capacitor compose a DRAM, and wherein the peripheral transistor portion comprises a planar MOS transistor in the active region.

12. The semiconductor device according to claim 10, further comprising a shallow-trench isolation region formed in the surface of the semiconductor substrate in a region other than the active region of the semiconductor substrate, wherein the trench isolation is formed so as to extend to the shallow-trench isolation region, and the conductive wiring is connected to a power-feeding contact in the shallow-trench isolation region.

13. The semiconductor device according to claim 10, wherein the conductive wiring includes material selected from the group consisting of polycrystalline silicon in which an impurity having a same conductivity type as the well region is doped, silicide of refractory metal, and a laminated body of a barrier metal layer and a metal layer.

14. The semiconductor device according to claim 10, wherein a MOS transistor is formed in the active region.

15. The semiconductor device according to claim 14, wherein in the active region, a shortest distance between a source and a drain of the MOS transistor and the conductive wiring in a thickness direction of the semiconductor substrate is 20 μm or longer.

16. The semiconductor device according to claim 10, wherein the trench isolation is a trench portion formed downwardly from the uppermost surface of the semiconductor substrate in a thickness direction thereof, the trench portion defining the active region in the well region, and a bottom of the trench portion being positioned within the well region, wherein the trench isolation comprises:

the conductive wiring formed in the bottom of the trench portion; and the insulating film formed so as to fill the trench portion from the uppermost surface of the semiconductor substrate down to the interface, and wherein the conductive wiring is electrically connected to the well region through an inner surface of the trench portion.

17. The semiconductor device according to claim 16, wherein the conductive wiring is electrically connected to the active region through one inner side surface of the trench portion.

18. The semiconductor device according to claim 16, further comprising a diffusion layer formed in the active region so as to directly contact with the inner surface of the trench portion and an outside surface of said conductive wiring located at the inner surface of the trench portion, the diffusion layer having a same conductivity type as the well region, wherein the conductive wiring is electrically connected to the well region through the diffusion layer.

19. The semiconductor device according to claim 18, wherein the trench isolation defines a plurality of the active regions in the well region,
at least part of the trench portion is positioned between the adjacent active regions, and
at least part of the conductive wiring is electrically connected to the adjacent active regions through two inner side surfaces of the trench portion opposite to each other.

20. The semiconductor device according to claim 19, wherein a bottom insulating film is formed in the bottom of the trench portion so that the bottom insulating film is continuously formed on the inner surface from the one inner side surface of the trench portion, through the inner bottom surface thereof, to the other inner side surface opposite to the one inner side surface, and,
the conductive wiring is formed on the bottom insulating film.

* * * * *